(12) United States Patent
Borthakur

(10) Patent No.: US 9,691,811 B1
(45) Date of Patent: Jun. 27, 2017

(54) IMAGE SENSOR CHIP SCALE PACKAGES AND RELATED METHODS

(71) Applicant: SEMICONDUCTOR COMPONENTS INDUSTRIES, LLC, Phoenix, AZ (US)

(72) Inventor: Swarnal Borthakur, Boise, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/171,966

(22) Filed: Jun. 2, 2016

(51) Int. Cl.
| | |
|---|---|
| H01L 27/146 | (2006.01) |
| H01L 21/66 | (2006.01) |
| H01L 23/00 | (2006.01) |
| H01L 23/31 | (2006.01) |

(52) U.S. Cl.
CPC ........ *H01L 27/14685* (2013.01); *H01L 22/32* (2013.01); *H01L 23/3171* (2013.01); *H01L 24/04* (2013.01); *H01L 27/14634* (2013.01); *H01L 27/14689* (2013.01)

(58) Field of Classification Search
CPC ......... H01L 21/02109; H01L 21/02365; H01L 21/02518; H01L 21/4814; H01L 2021/60; H01L 2021/60277; H01L 2021/603
See application file for complete search history.

(56) References Cited

U.S. PATENT DOCUMENTS

| | | | |
|---|---|---|---|
| 9,293,495 B2 | 3/2016 | Borthakur et al. | |
| 9,324,755 B2 | 4/2016 | Borthakur et al. | |
| 9,349,767 B2 | 5/2016 | Borthakur et al. | |
| 2005/0253213 A1 | 11/2005 | Jiang et al. | |
| 2008/0191334 A1 | 8/2008 | Lee et al. | |

OTHER PUBLICATIONS

Semiconductor Components Industries, LLC d/b/a on Semiconductor, "TND6116/D Image Sensor Terminology," Rev. 2, Jul. 2014, available online at http://www.onsemi.com/pub_link/Collateral/TND6116-D.PDF, last visited May 19, 2016.

*Primary Examiner* — Cheung Lee
(74) *Attorney, Agent, or Firm* — Adam R. Stephenson, Ltd.

(57) ABSTRACT

Methods of forming an image sensor chip scale package. Implementations may include providing a semiconductor wafer having a pixel array, forming a first cavity through the wafer and/or one or more layers coupled over the wafer, filling the first cavity with a fill material, planarizing the fill material and/or the one or more layers to form a first surface of the fill material coplanar with a first surface of the one or more layers, and bonding a transparent cover over the fill material and the one or more layers. The bond may be a fusion bond between the transparent cover and a passivation oxide; a fusion bond between the transparent cover and an anti-reflective coating; a bond between the transparent cover and an organic adhesive coupled over the fill material, and/or; a bond between a first metallized surface of the transparent cover and a metallized layer coupled over the wafer.

20 Claims, 22 Drawing Sheets

IMAGE SENSOR CHIP SCALE PACKAGES AND RELATED METHODS

BACKGROUND

1. Technical Field

Aspects of this document relate generally to image sensor semiconductor packages. More specific implementations involve chip scale complementary metal-oxide semiconductor (CMOS) image sensor (CIS) semiconductor packages.

2. Background

Image sensors convey information related to an image by communicating signals in response to incident electromagnetic radiation. Image sensors are used in a variety of devices including smart phones, digital cameras, night vision devices, medical imagers, and many others. Conventional semiconductor imagers utilizing charge-coupled device (CCD) and CMOS architectures are currently in use. Chip scale packages (CSPs) exist and are sometimes defined by a size of the package relative to a die of the package.

SUMMARY

Implementations of methods of forming image sensor chip scale packages (CSPs) may include: providing a semiconductor wafer (wafer) having an array of pixels; forming a first cavity through the wafer and/or one or more layers coupled over the wafer; filling the first cavity with a fill material; planarizing the fill material and/or the one or more layers to form a first surface of the fill material that is coplanar with a first surface of the one or more layers, and; forming an image sensor chip scale package (CSP) by bonding a transparent cover over the fill material and over the one or more layers using either: a fusion bond between the transparent cover and a passivation oxide, or; a fusion bond between the transparent cover and an anti-reflective coating.

Implementations of methods of forming image sensor CSPs may include one, all, or any of the following:

No adhesive may be used to bond the transparent cover over the fill material and over the one or more layers.

The anti-reflective coating (ARC) may be coupled over the passivation oxide.

The ARC may be coupled over an organic layer.

The planarizing may include chemical mechanical polishing (CMP).

The fill material may include an oxide.

The method may include forming a cavity and/or a lens in the transparent cover.

The image sensor CSP may include a plurality of stacked semiconductor wafers.

The method may include forming a second cavity through the wafer and/or the one or more layers and filling the second cavity with the fill material and/or a second fill material.

The first surface of the fill material may be coplanar with a plane that intersects a color filter array (CFA) of the image sensor CSP.

Implementations of methods of forming image sensor chip scale packages (CSPs) may include: providing a semiconductor wafer (wafer) having an array of pixels; forming a first cavity through the wafer and/or one or more layers coupled over the wafer; filling the first cavity with a fill material; planarizing the fill material and/or the one or more layers to form a first surface of the fill material that is coplanar with a first surface of the one or more layers, and; after planarizing, forming an image sensor chip scale package (CSP) by bonding a transparent cover over the fill material and over the one or more layers by bonding the transparent cover with an organic adhesive coupled over the fill material.

Implementations of methods of forming image sensor CSPs may include one, all, or any of the following:

The planarizing may include chemical mechanical polishing (CMP).

The method may include forming a second cavity through the wafer and/or the one or more layers, filling the second cavity with the fill material and/or a second fill material, and planarizing the fill material and/or the second fill material to form a second surface coplanar with the first surface of the one or more layers, the second surface formed directly over the second cavity.

The method may include forming one or more openings through a layer defining the first cavity to test one or more electrical functions of the image sensor CSP.

Implementations of methods of forming image sensor chip scale packages (CSPs) may include: providing a semiconductor wafer (wafer) having an array of pixels; forming a first cavity through the wafer and/or one or more layers coupled over the wafer; filling the first cavity with a fill material; planarizing the fill material and/or the one or more layers to form a first surface of the fill material that is coplanar with a first surface of the one or more layers, and; forming an image sensor chip scale package (CSP) by bonding a transparent cover over the fill material and over the one or more layers by bonding a first metallized surface of the transparent cover with a metallized layer coupled over the wafer.

Implementations of methods of forming image sensor CSPs may include one, all, or any of the following:

No adhesive may be used to bond the transparent cover over the fill material and over the one or more layers.

The first metallized surface may include oxide in particular locations that correspond with particular locations of oxide included in the metallized layer.

The method may include forming a second cavity through the wafer and/or the one or more layers, filling the second cavity with the fill material and/or a second fill material, planarizing the fill material and/or the second fill material to form a second surface coplanar with the first surface of the fill material, and bonding the transparent cover over a full diameter of the first cavity and over at least a portion of a diameter of the second cavity.

The method may include forming a cavity and/or a global lens in the transparent cover.

The method may include forming at least a portion of a testing contact within the first cavity, the testing contact configured to test one or more electrical functions of the image sensor CSP.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended image sensor chip scale packages and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such image sensor chip scale packages and related methods, and implementing components and methods, consistent with the intended operation and methods.

Figure 15:
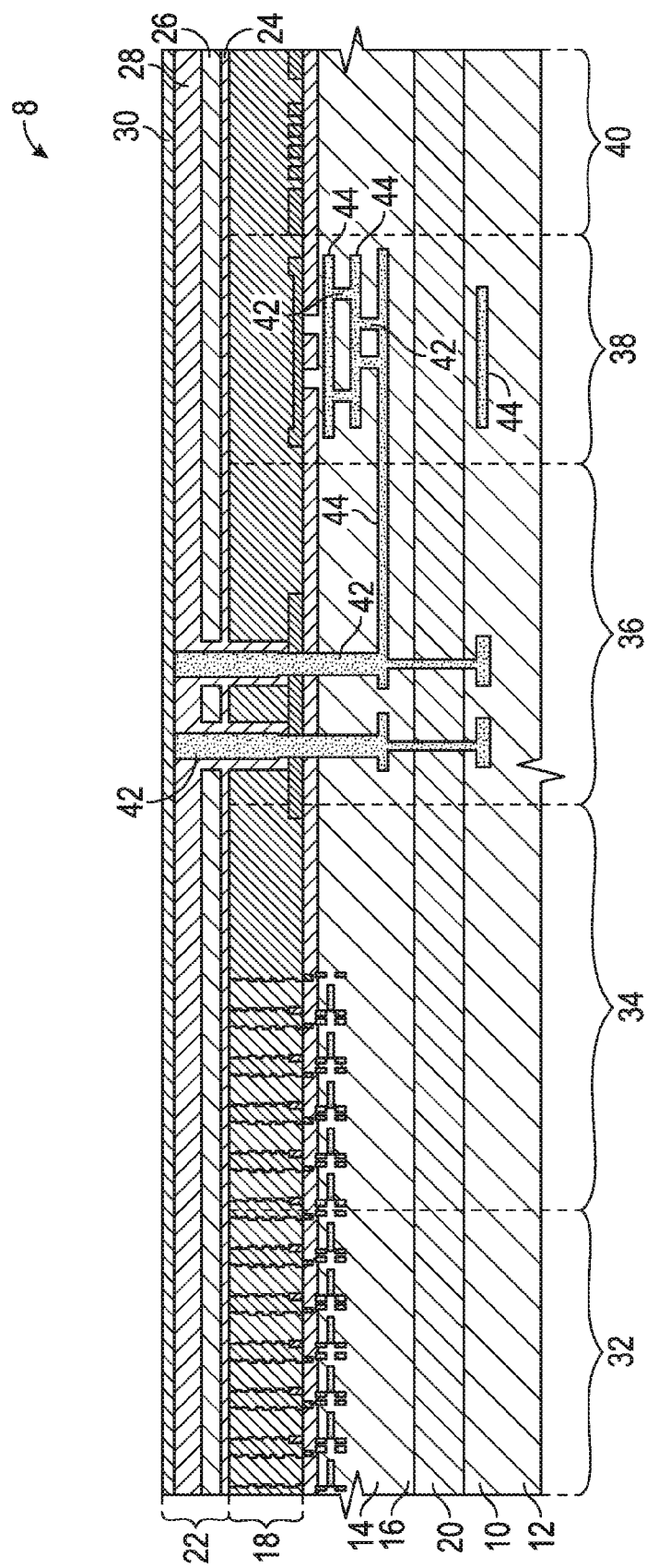
FIG. 15 is a side cross-section view representatively illustrating one or more method steps used in the formation of the assembly of FIG. 26.

Reference is made initially to FIG. 15, which shows an assembly 8 that is used in the formation of an image sensor chip scale package (CSP). The assembly includes a first semiconductor wafer (wafer) 10 which, in the implementation shown, is an application-specific integrated circuit (ASIC) wafer 12 containing various ASIC die. A second semiconductor wafer (wafer) 14, which in the implementation shown is a sensor wafer 16, includes various sensor die, each containing an array of pixels (pixel array) 18. The ASIC wafer 12 and sensor wafer 16 are fusion bonded using a passivation oxide 20.

In various implementations, any semiconductive materials could be used to form the wafers, such as silicon, gallium arsenide, or other semiconductive materials and hybrid, as well as fusion bonding could be used to bond the wafers. In the implementations shown they are formed of silicon and the passivation oxide bonding them together is a silicon oxide. Although the specific example of a sensor wafer stacked with an ASIC wafer is shown, other types of wafers and wafer configurations could be utilized in other implementations. For the exemplary purposes of this disclosure, the pixel array has a thickness (top to bottom) of about 2.7 microns. Other thicknesses could be used in various implementations.

A number of layers 22 are coupled over the sensor wafer. In the implementation illustrated there is a first layer 24, second layer 26, third layer 28, and fourth layer 30. In other implementations fewer or more layers could be included, including various materials like HfOx, Ta2O5, SiO2, SiN, or SiON.

The assembly also includes various portions or areas. An active pixel area (active pixel array) 32 includes those pixels that will be operational and/or that will receive sensed light information to communicate data through the ASIC wafer to one or more elements external to the image sensor CSP. A shield area 34 (which may be formed using a metal shield) defines an area where pixels will be covered by a shield and therefore not active. A three-dimensional (3D) pad area 36 includes vertical vias 42 that electrically couple the sensor wafer (or portions thereof) with the ASIC wafer (or portions thereof) and also includes one or more horizontal lines 44 for electrical coupling.

A test pad area (e-pad area) 38 includes a number of vertical vias and horizontal lines and may be utilized at various steps in the manufacturing process to perform one or more electrical tests of the CSP and/or electrical sensor that is being formed. Any of the vertical vias may be through-silicon vias (TSVs) and/or through-oxide vias (TOVs). A scribe line (SL) area (alignment marks areas) 40 defines a portion of the stacked assembly that will be used for assisting with alignment of color filter array and microlenses, later singulation and/or alignment of a saw or other singulation mechanism for singulating individual image sensor CSPs that are formed. The scribe line area in the implementation shown includes scribe line marks (SPMs).

Figure 16:
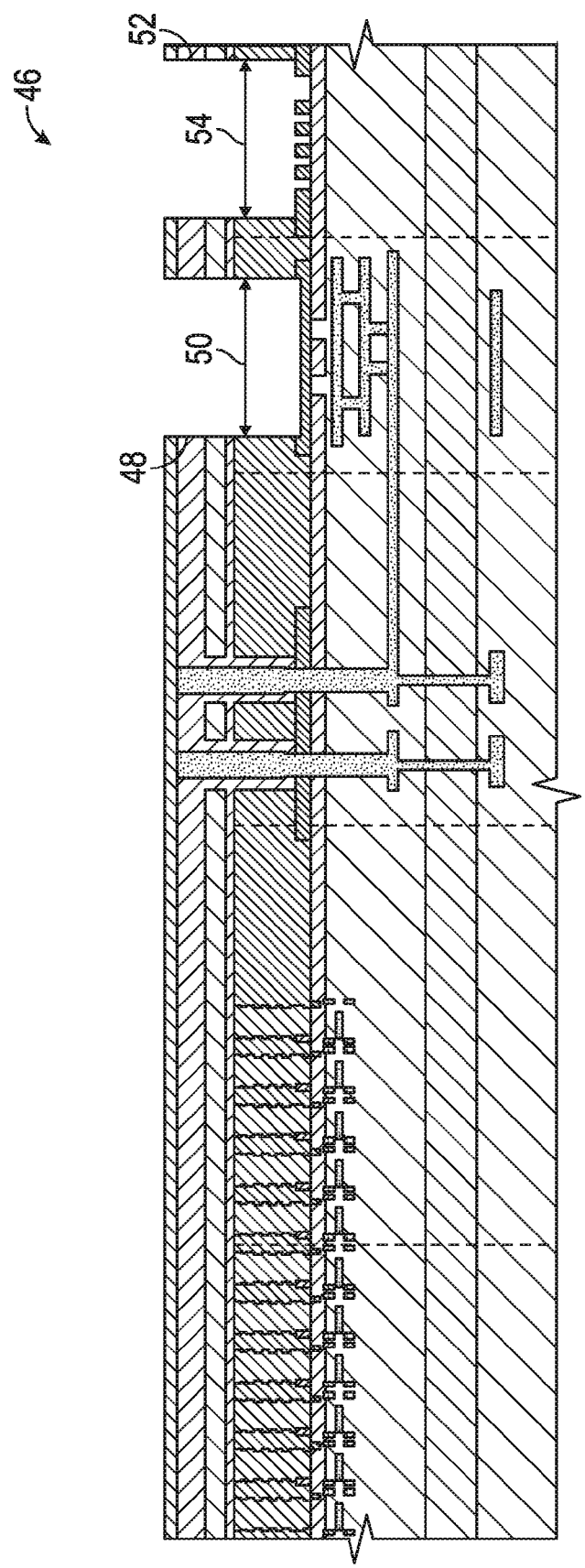
FIG. 16 is a side cross-section view representatively illustrating one or more additional method steps used in the formation of the assembly of FIG. 26.

FIG. 16 shows an assembly 46 that is formed from assembly 8 using one or more method steps. FIG. 16 shows that a first cavity 48 is formed in the test pad area and that a second cavity 52 is formed in the scribe line area. First cavity has a diameter 50 and second cavity has a diameter 54. The cavities may be any shape, such as cuboid, rectangular cuboid, cylindrical, and so forth (thus "diameter" is not meant to imply that the cavities are circular or cylindrical), and may be formed through etching or using any other material removal techniques. The first cavity will be used to place one or more probe pads or test pads (test contacts), and the second cavity will be used to expose alignment marks (SPMs). When a transparent cover is later placed over the assembly it may be placed so that it is over the entire diameter 50 and the entire diameter 54 (as is seen in the drawing implementations)—though in other implementations the transparent cover may be located over the entire diameter 50 and over only a portion (but not the entirety) of diameter 54.

It may be stated here that, while the methods and processes being described are being described in the singular, as if a single CSP is being formed, in reality these processes are being performed throughout the surface(s) and or within the stacked wafer(s) to simultaneously form a plurality of CSPs, and accordingly many first cavities and second cavities may be simultaneously formed, corresponding with many individual image sensor CSPs that will be later singulated.

The formation of image sensors may include many other additional or alternative steps and/or may include other elements/structures than those specifically disclosed herein. Various method steps and elements are described in U.S. Pat. No. 9,349,767, issued May 24, 2016, listing as first inventor Swarnal Borthakur and titled "Image Sensors with Through-Oxide Via Structures"; U.S. Pat. No. 9,324,755, issued Apr. 26, 2016, listing as first inventor Swarnal Borthakur and titled "Image Sensors with Reduced Stack Height"; U.S. Pat. No. 9,293,495, listing as first inventor Swarnal Borthakur and titled "Imaging Circuitry with Robust Scribe Line Structures," issued Mar. 22, 2016; and "TND6116/D Image Sensor Terminology," Rev. 2, published July, 2014 by ON Semiconductor of Phoenix, Ariz., submitted herewith as Appendix A, the entire disclosures of each of which are incorporated herein by reference. The incorporated patents discuss, among other things, stacking methods/processes and processes for forming color filter array (CFA)/microlens (uLens)/anti-reflective coating (ARC) structures.

Figure 17:
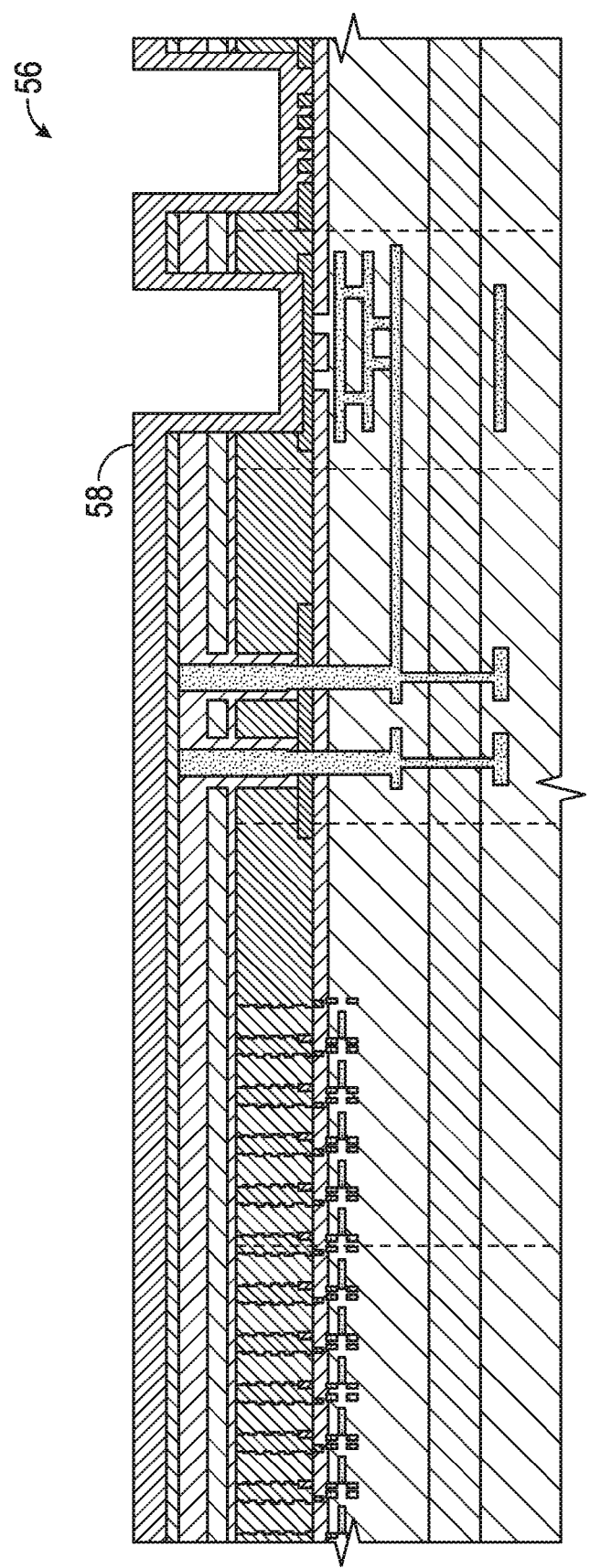
FIG. 17 is a side cross-section view representatively illustrating one or more additional method steps used in the formation of the assembly of FIG. 26.
Figure 18:
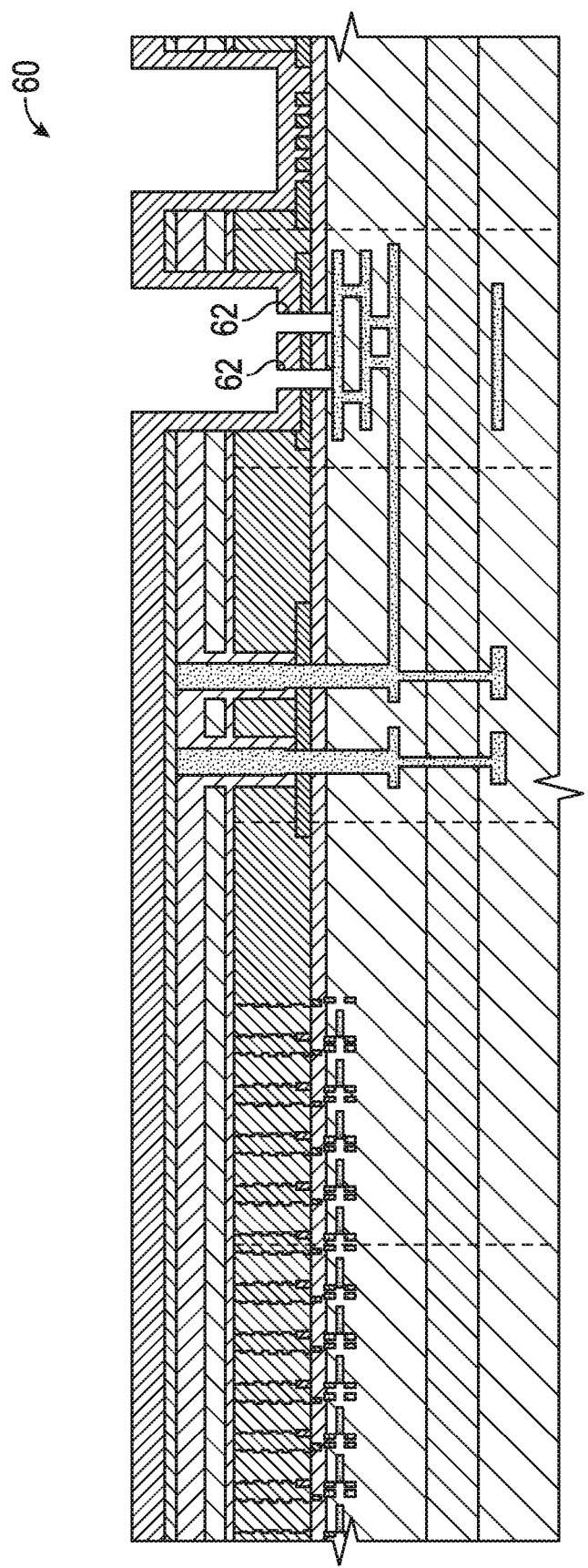
FIG. 18 is a side cross-section view representatively illustrating one or more additional method steps used in the formation of the assembly of FIG. 26.

Referring now to FIG. 17, assembly 56 is formed by forming an oxide layer 58 over the assembly of FIG. 16. This may be, by non-limiting example, a silicon oxide layer, though it could be formed of some other passivating/coating material. The oxide layer 58 passivates the silicon sidewall of the sensor wafer that was exposed by forming the above-mentioned cavities. FIG. 18 shows assembly 60 which is formed by forming openings 62 at a bottom of the first cavity to expose one or more of the horizontal lines and/or vertical vias. In the implementation illustrated, the vertical vias and horizontal lines are formed of copper though in other implementations other electrically conductive elements could be used such as aluminum, gold, nickel, alloys, and so forth. Openings 62 are seen to pass through the oxide layer 58 and one or more layers or other elements of the sensor wafer, including an inter-layer dielectric (ILD) directly below the oxide layer 58, to expose one or more horizontal lines and/or vertical vias. The openings 62 may be formed using etching or any other material removal technique.

Figure 19:
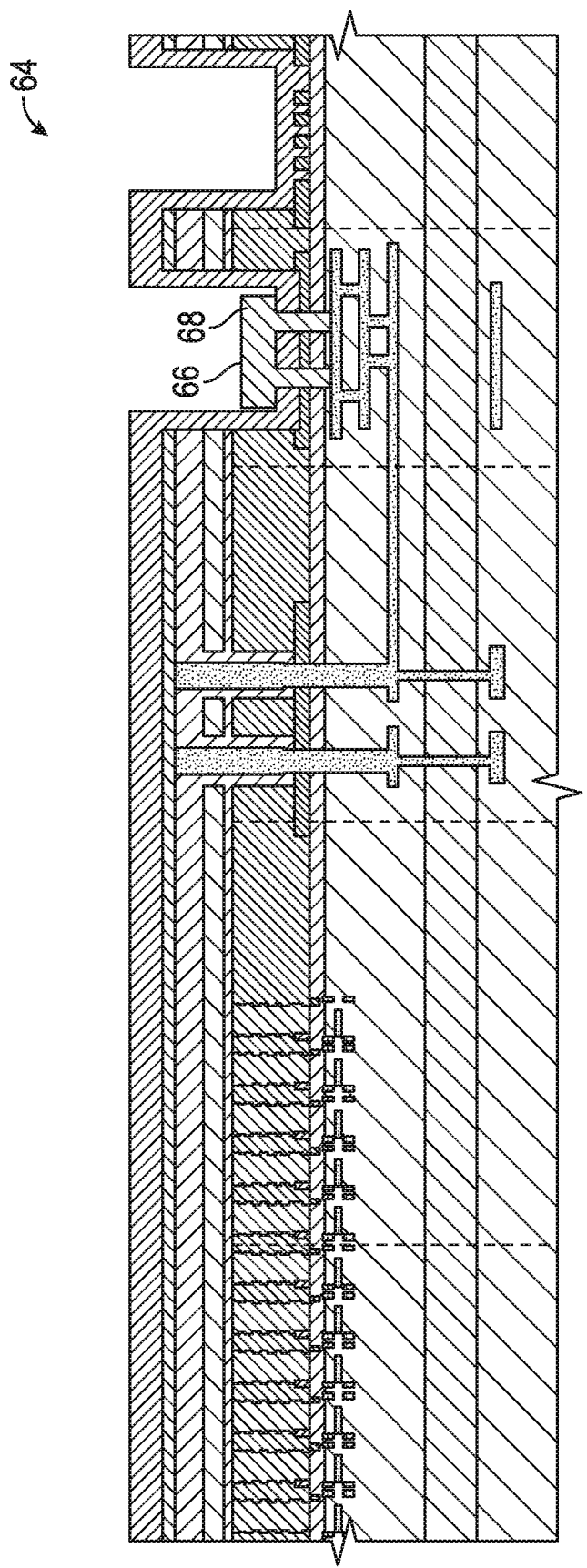
FIG. 19 is a side cross-section view representatively illustrating one or more additional method steps used in the formation of the assembly of FIG. 26.

FIG. 19 shows an assembly 64 that is formed by forming a testing contact 66 at least partially within the first cavity. The testing contact in the implementation shown is an aluminum pad 68, though other electrically conductive materials could be used such as those discussed above with respect to the vertical vias/horizontal lines, and is seen to have a horizontal pad portion and a plurality of vertical portions that extend through the openings 62 to contact one or more of the horizontal lines and/or vertical vias of the test pad area of the wafer stack. The testing contact may be formed by using any of the material deposition techniques described above, electrodeposition, sputtering, or any other material deposition technique, and/or any material removal technique.

The testing contact will be used for testing one or more functions, properties, characteristics, behaviors, and so forth, of elements of the image sensor CSP. Since the implementation shown is a chip scale package, the testing contact will not be used later for electrical coupling with any external elements after it is used for testing. Accordingly, there may not be actually a necessity to create a testing contact in order to perform the testing, and instead the testing may be done directly by contacting one or more horizontal lines and/or vertical vias directly through the openings 62 or (another larger opening) without ever depositing or placing a separate testing contact.

Figure 20:
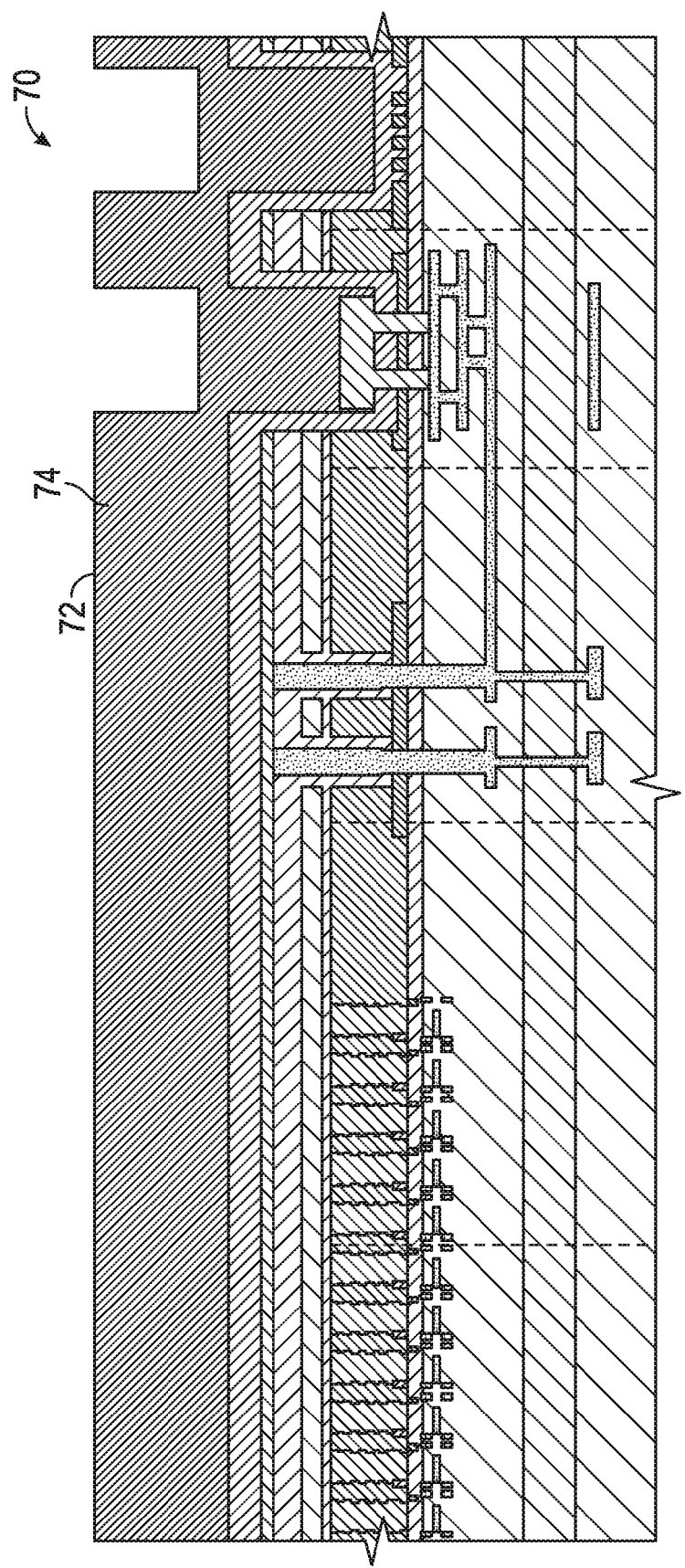
FIG. 20 is a side cross-section view representatively illustrating one or more additional method steps used in the formation of the assembly of FIG. 26.

FIG. 20 shows an assembly 70 that is formed by depositing a fill material 72 over the assembly of FIG. 19. In the implementation shown the fill material 72 is an oxide 74, and may be a silicon oxide, though in other implementations other oxides, passivation materials, or other coating materials could be used. Any deposition technique could be used to deposit the fill material such as, by non-limiting example, sputtering, physical vapor deposition (PVD), chemical vapor deposition (CVD), spin-on-glass, and so forth.

Figure 21:
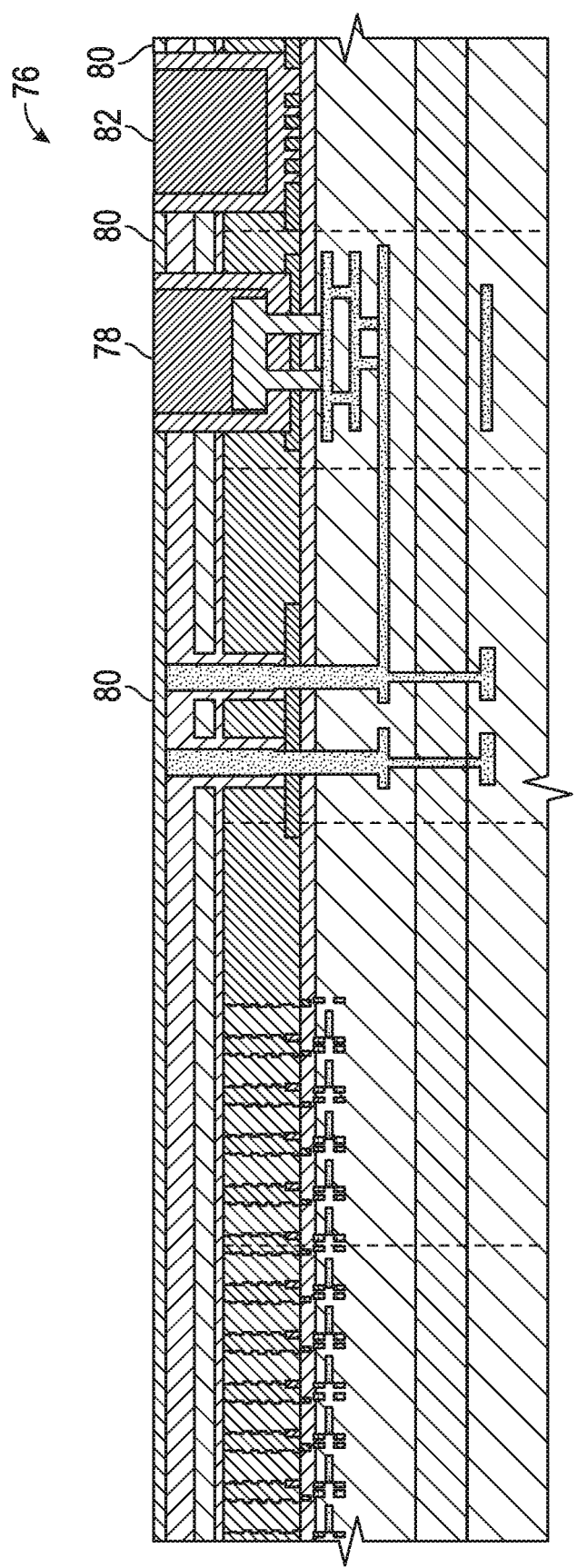
FIG. 21 is a side cross-section view representatively illustrating one or more additional method steps used in the formation of the assembly of FIG. 26.

FIG. 21 shows an assembly 76 that is formed by planarizing the assembly of FIG. 21. The planarizing may be done using any planarizing technique (lapping, buffing, grinding, etc.), but in the representative implementation it is done using chemical mechanical polishing (CMP). It may be seen that the planarization step in the representative method not only removes some of the fill material but also may remove some of the material of the layers 22. This may not necessarily be the case in every implementation, but in the representative example the CMP process may remove some of the fill material and, additionally, all of the oxide layer 58 that sat atop the fourth layer 30, so that the fourth layer 30 is again exposed. In some cases, the planarizing could also remove some of the fourth layer as well and/or could leave some of the oxide layer 58, and/or could not remove any of the oxide layer 58. The removal of the portion of the oxide layer 58 that covers the fourth layer, however, results in a decreased thickness for the image sensor CSP.

The planarization planarizes the upper surface of the assembly 76 so that a first surface 78 of the fill material (corresponding with the first cavity), a first surface 80 of the layers 22, and a second surface 82 of the fill material (corresponding with the second cavity) are all substantially coplanar or coplanar. The first surface 78 is seen to be directly over the first cavity and the second surface 82 is seen to be directly over the second cavity. The removal of some of the fill material and other materials may be done such as, by non-limiting example, by using photolithography and etching processes, or any other material removal processes. In some implementations, a one or more etching processes may be performed to bring the height down and then one or more CMP processes may be done to more finely planarize the surface of the stack in order to achieve a coplanar configuration.

Figure 22:
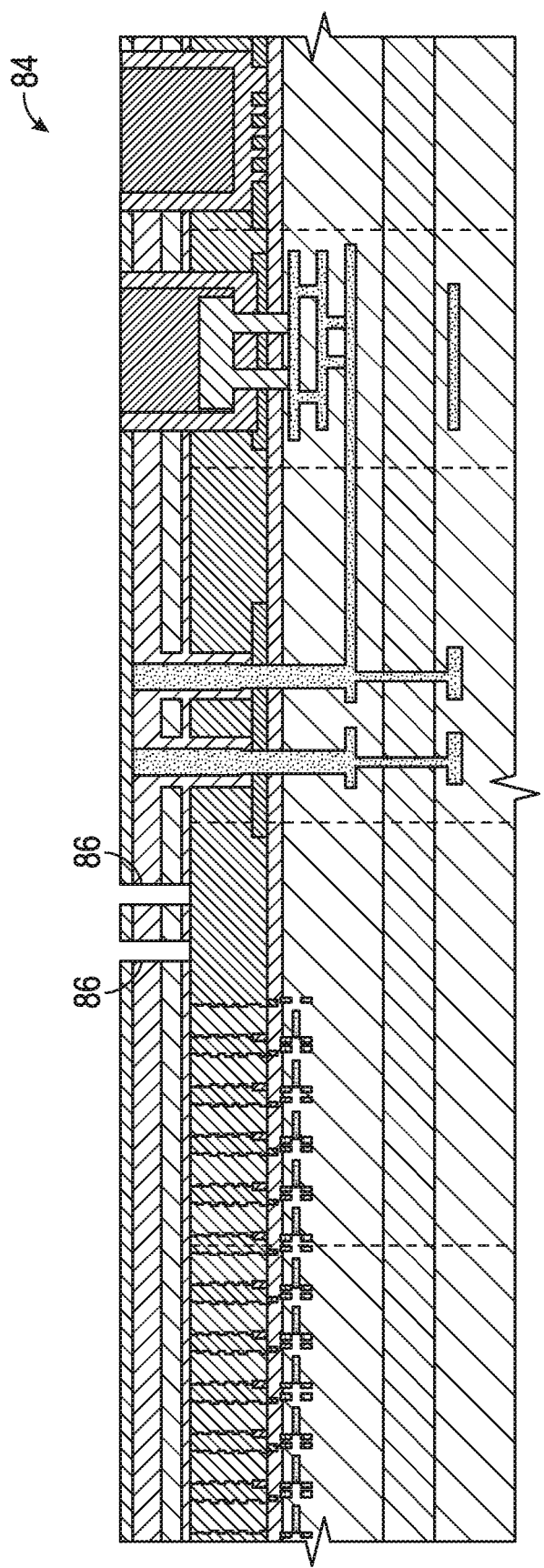
FIG. 22 is a side cross-section view representatively illustrating one or more additional method steps used in the formation of the assembly of FIG. 26.
Figure 23:
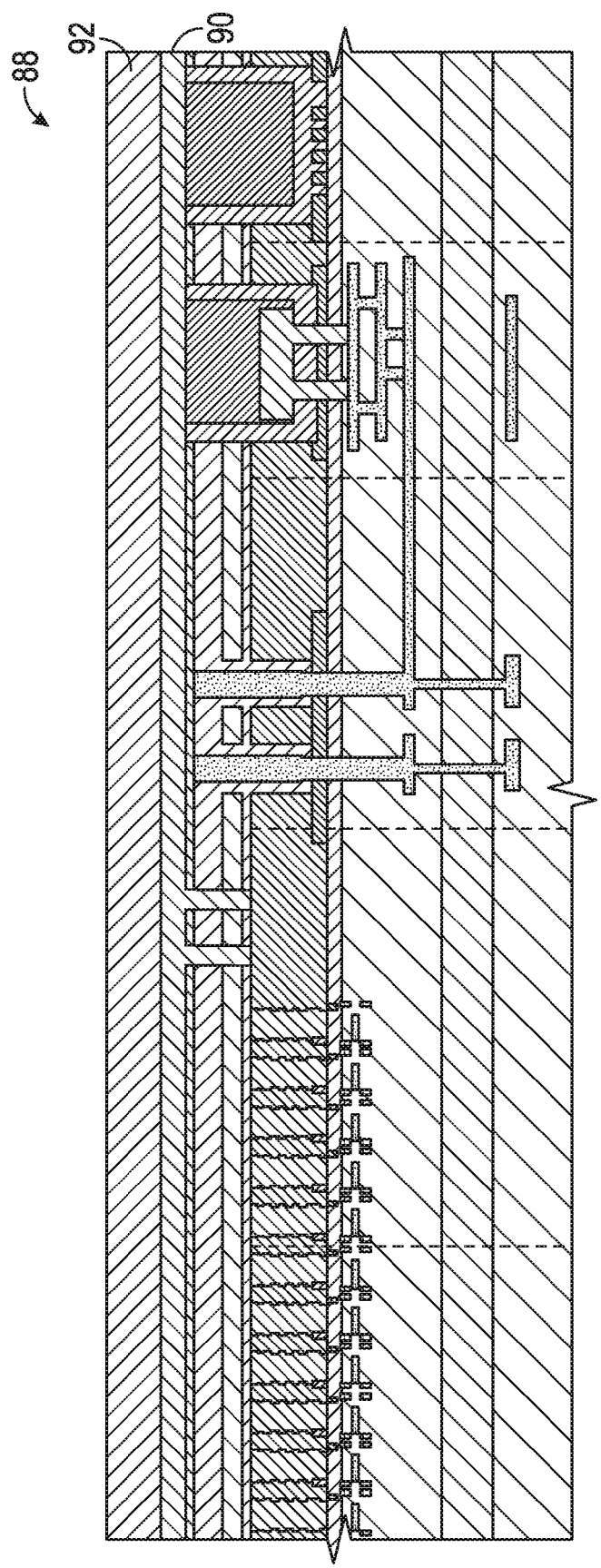
FIG. 23 is a side cross-section view representatively illustrating one or more additional method steps used in the formation of the assembly of FIG. 26.

FIG. 22 shows an assembly 84 that is formed by forming openings 86 through the layers 22 to expose the sensor wafer. These may be formed using any material removal techniques such as photolithographic patterning and etching, laser drilling, and so forth. FIG. 23 shows an assembly 88 that is formed by forming a shield layer 90 over the fourth layer and by forming a layer 92 of the shield layer. The shield layer may be formed of TiN, Ti, Ta, TaN, W, or WN while the layer 92, although shown as one layer, actually may include a SiN, SiO2, or SiON layer. The openings 86 may be used so that the shield layer may be grounded by contacting it with the sensor wafer.

Figure 2:
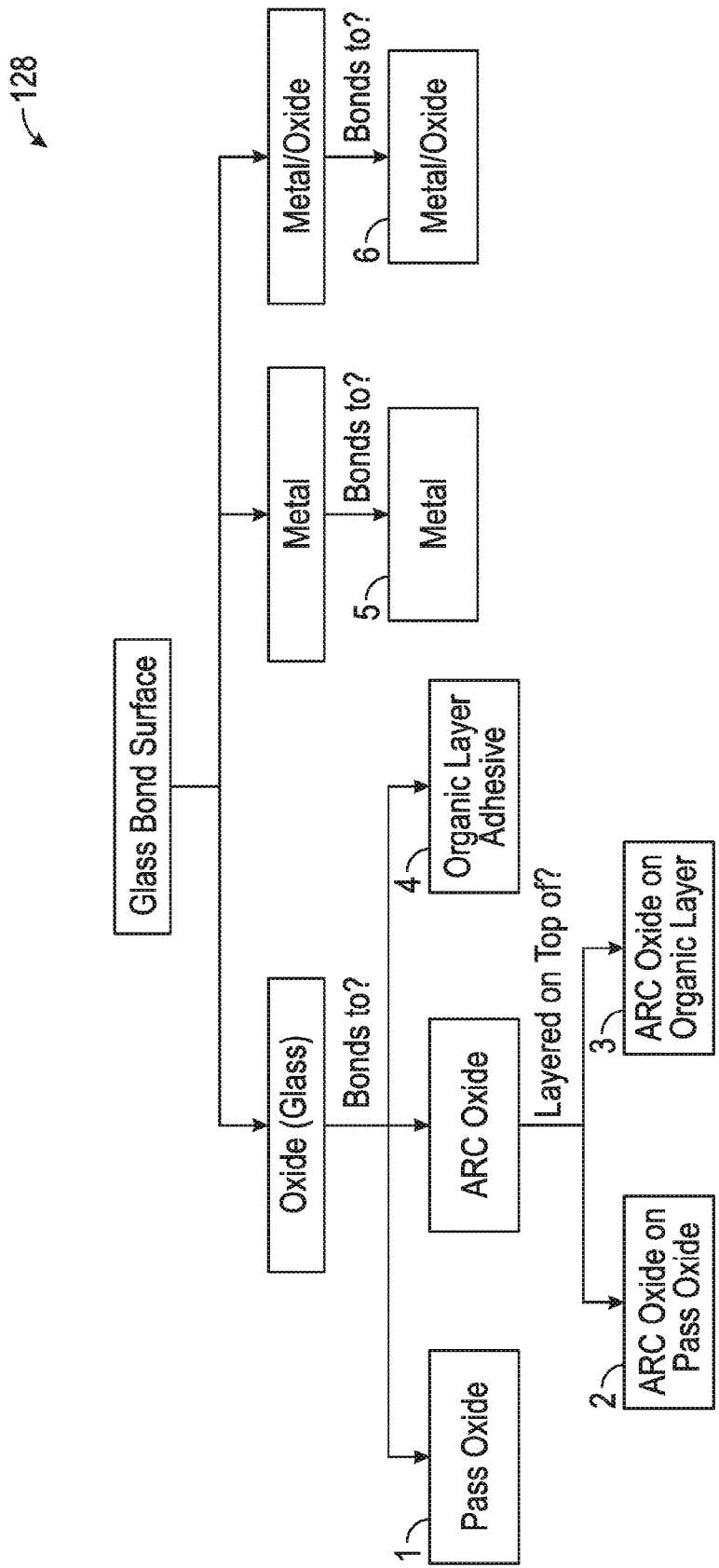
FIG. 2 is a view of a diagram showing multiple bonding alternatives between a transparent cover and other elements of an image sensor CSP.
Figure 24:
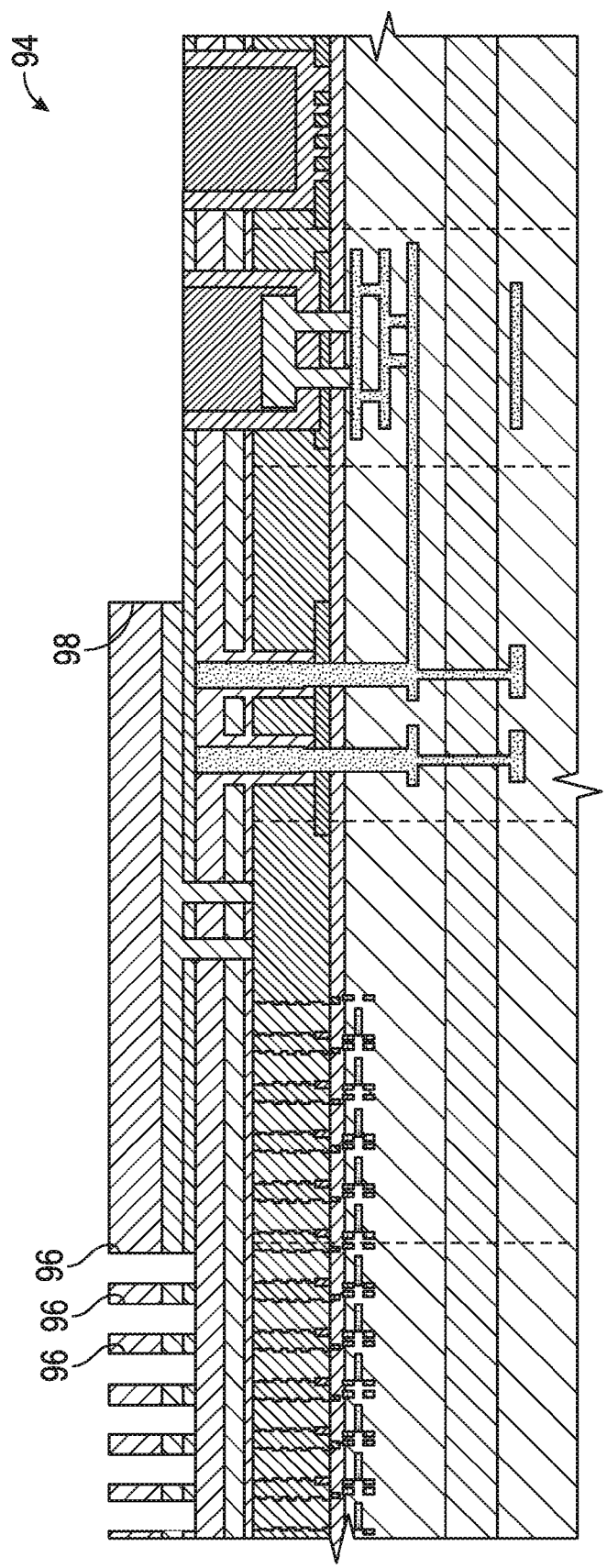
FIG. 24 is a side cross-section view representatively illustrating one or more additional method steps used in the formation of the assembly of FIG. 26.

FIG. 24 shows an assembly 94 that is created by forming a plurality of openings 96 through the shield layer and layer 92 and by forming a larger opening 98 which exposes a portion of the previously planarized surface including the first surface 78, first surface 80, and second surface 82. These openings may be formed using any material removal techniques, such as photolithographic patterning and etching or any other technique, and result in the formation of a composite grid of openings corresponding with the pixel array. Reference is made, for example to FIG. 2 of Appendix A, which shows a top view of an array of photodiodes exposed through a corresponding array of openings in a metal light shield, which is similar to the configuration represented by the cross-section of FIG. 24, wherein the shield layer forms a metal light shield and the shield layer and layer 92 are used to form a color filter-in-a-box (CIAB) structure.

Figure 25:
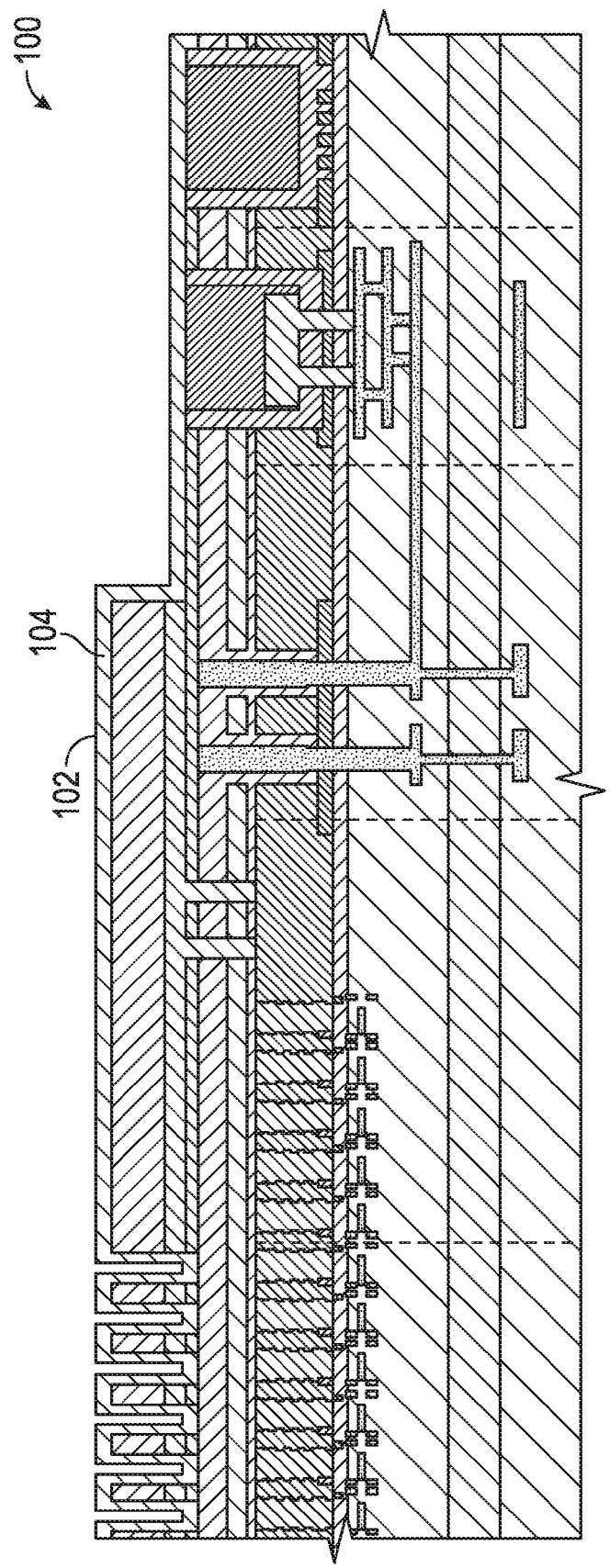
FIG. 25 is a side cross-section view representatively illustrating one or more additional method steps used in the formation of the assembly of FIG. 26.
Figure 26:
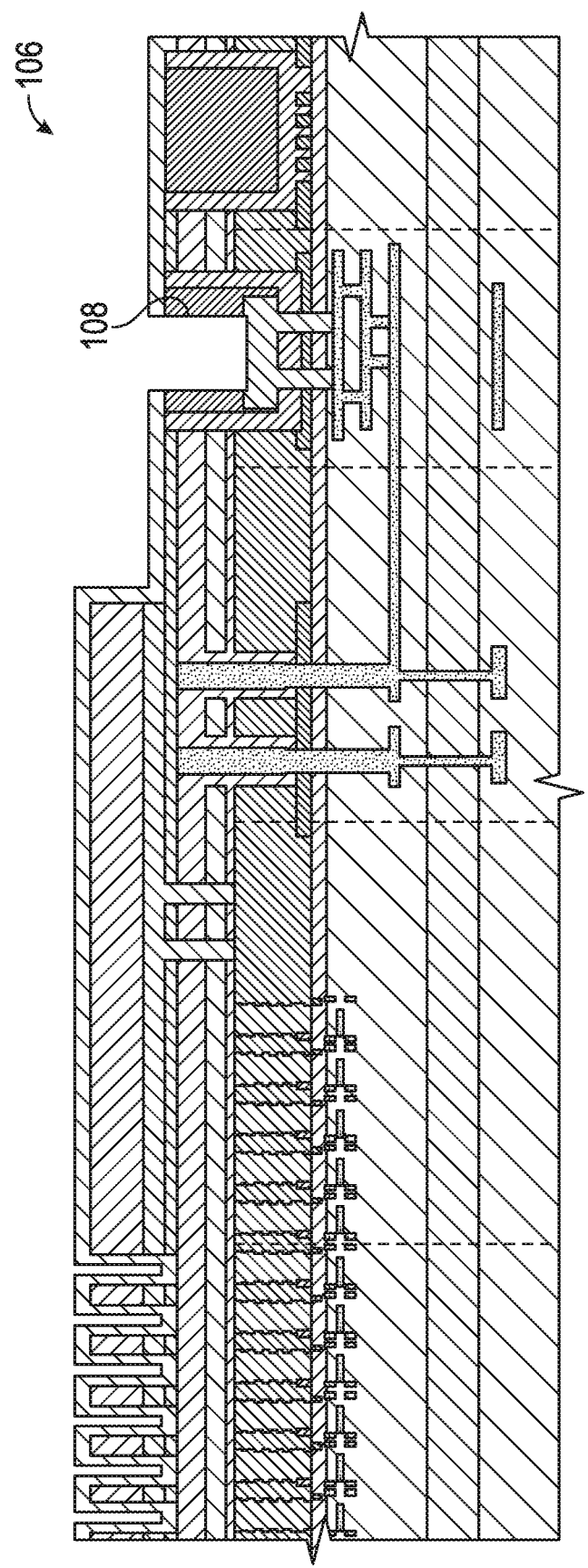
FIG. 26 is a side cross-section view of an implementation of an assembly used in the formation of the assemblies of FIGS. 1 and 2-8.

FIG. 25 shows an assembly 100 that is formed by depositing a layer 102 of material over the assembly shown in FIG. 24. Layer 102 in the implementation shown is a passivation oxide 104, and could for example be a silicon oxide or some other passivation oxide/material. The layer 102 in implementations may protect the tungsten sidewall of the shield layer. FIG. 26 shows an assembly 106 that is formed from the assembly shown in FIG. 25 by forming an opening 108 through the passivation oxide 104 and through the fill material that was in the first cavity, thus exposing the testing contact. This may be done using any material removal technique, such as photolithographic patterning and etching or any other technique. As described previously, in implementations the testing contact may be excluded and in such cases the opening 108 could expose one or more horizontal lines and/or vertical vias of the test pad area directly. In such cases the steps shown in FIGS. 18-19 may be excluded and opening 108 may go all the way through to the horizontal lines and/or vertical vias—or one or more openings 62 could be included as shown in FIG. 18, the step(s) shown in FIG. 19 could be excluded, and opening 108 could then expose the one or more openings 62 to allow for the testing. For the exemplary purposes of this disclosure, the left portion of FIG. 25 the shield layer 90 and passivation oxide 104 combined may have a thickness (top to bottom) of, or of about, 0.8 microns.

Assembly 106 is a sub-assembly that may be used to form a variety of other assemblies or image sensor CSP configurations. For example, referring now to FIG. 1, an assembly 110 is shown which is formed from assembly 106 by forming a color filter array (CFA) 112, a lens layer 116, and an anti-reflective coating (ARC) layer 122 on assembly 106. The CFA 112 is formed by depositing color filters 114 within cavities over the pixels. This may be done by any material deposition technique, such as selective patterning and deposition, and the like. Different materials may be deposited into neighboring cavities to provide for the desired color filtering—so that for example one color filter filters incident light so that red light passes through to the pixel below, another neighboring color filter filters incident light so that green light passes through to the pixel below, and so forth. The formation of the color filters may also include material removal techniques if the material deposition techniques result in color filter material being deposited outside the corresponding cavities for the color filters.

Figure 1:
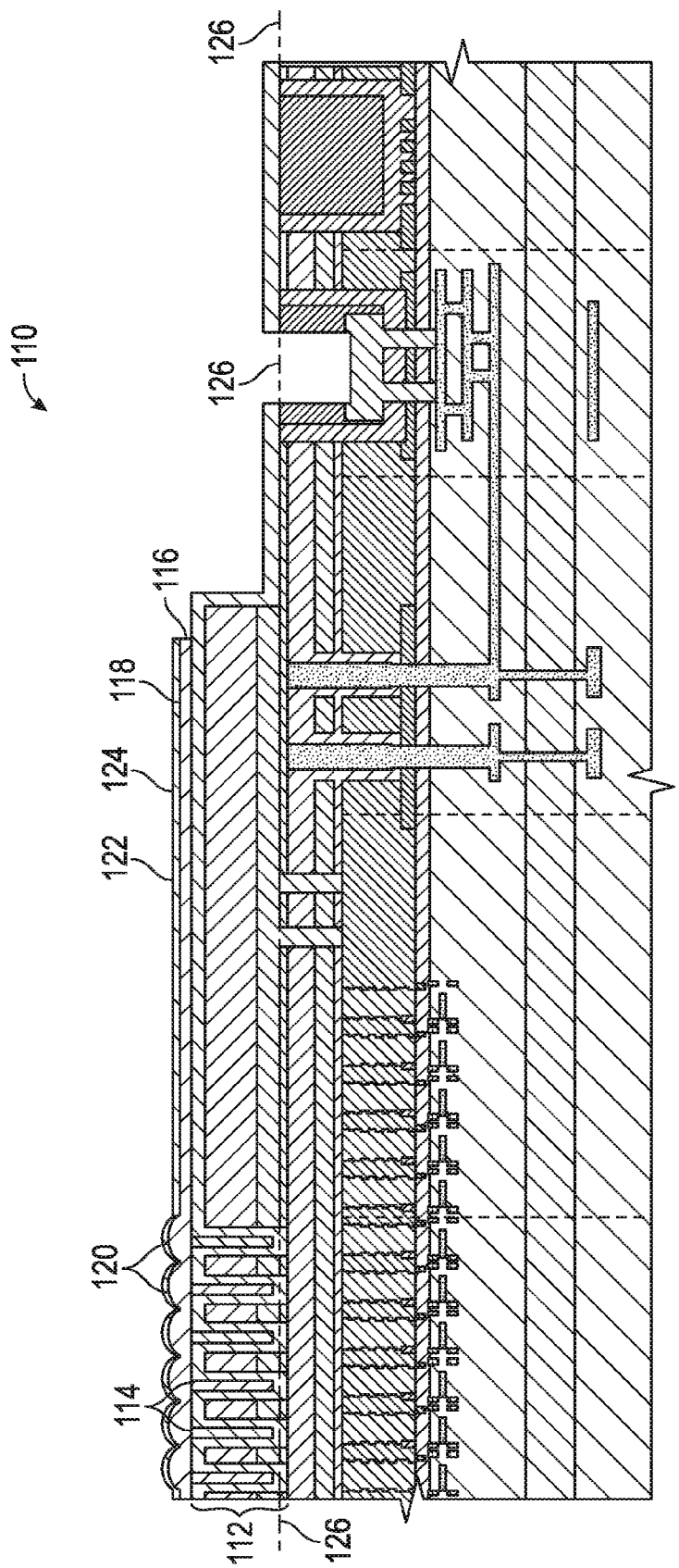
FIG. 1 is a side cross-section view of an implementation of an assembly used in the formation of an image sensor chip scale package (CSP)

A planarization layer is deposited over the CFA and the lens layer 116 is formed over the planarization layer to focus incident light into the color filters and towards the pixels below. In the Figure the planarization layer and the lens layer are shown as one. The lens layer 116 is formed of an organic layer 118 in the implementation illustrated, and includes a number of lenses 120, each lens situated over and corresponding with one of the active pixels. The lens layer 116 may be formed using any material deposition and/or material removal techniques. The anti-reflective coating (ARC) (layer) 122 is formed of an oxide 124 and may be formed using any material deposition and/or material removal technique(s). The ARC 122 is seen to conform to the shape of the lens layer 116 so that the lenses function properly (and in fact each lens accordingly is formed not only of the lens layer but also of the ARC layer—and thus in implementations the ARC layer may enhance the functioning of the lens formations in the lens layer by providing some additional focusing or enhancing of incident light). FIG. 1 shows that the first surface 78 of the fill material within the first cavity, the first surface 80 of the layers 22, and the second surface 82 of the fill material within the second cavity all lie in (and are coplanar with) a plane 126 that passes through the color filter array (CFA) 112.

Assembly 110 is a sub-assembly that may be used to form other assemblies as shown in FIGS. 3 and 6-8 which are used to form image sensor CSPs. FIG. 2 shows a diagram 128 which representatively illustrates a possible number of assemblies that may be formed using different bonding combinations between a transparent cover (which in the representative example is a glass oxide having a glass bond surface) with other portions of the stacked assemblies 110 or 106. FIG. 2 shows that a first assembly 1 may be formed by bonding the glass with a passivation oxide. Assembly 2 is formed by bonding a glass oxide with an ARC oxide that is layered over a passivation oxide. Assembly 3 is formed by bonding a glass oxide with an ARC oxide that is layered over an organic layer. Assembly 4 is formed by bonding a glass oxide with an organic layer adhesive. Assembly 5 is formed by forming a first metallized surface on the glass or transparent cover itself, forming a metallized layer over the wafer structure, and then fusion bonding the metallized layer with the first metallized surface. Assembly 6 is formed by forming a pattern of metal and oxide on the transparent cover, forming a corresponding pattern of metal and oxide over the wafer stack, and then fusion bonding the two corresponding patterns of metal/oxide with one another to form a hybrid bond. Each of these bonding configurations will now be discussed in more detail. It should be noted that with assemblies 1-3 and 5-6, no adhesive is used to bond the transparent cover with the wafer stack.

Figure 3:
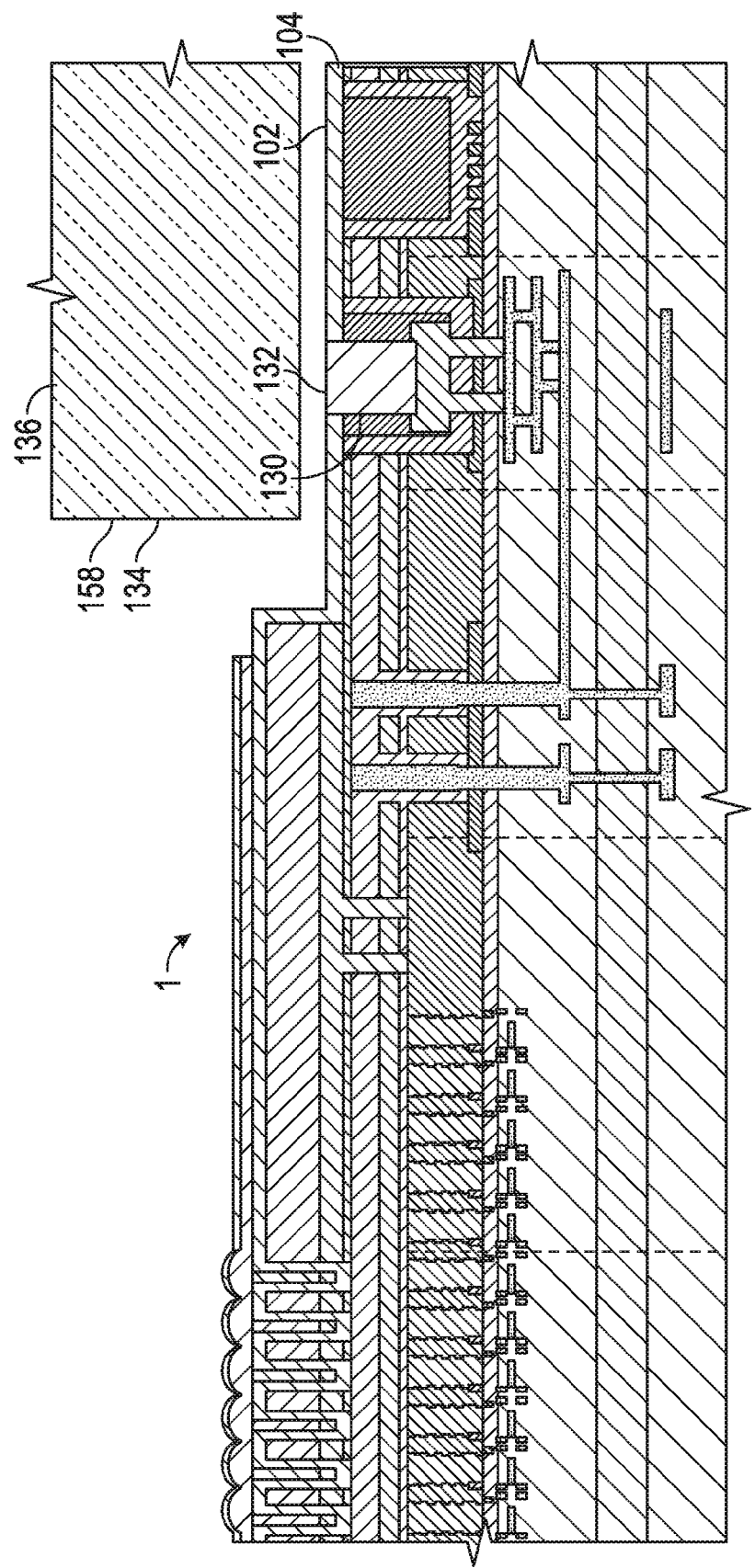
FIG. 3 is a side cross-section view of an implementation of an assembly used in the formation of an image sensor CSP.

Referring now to FIG. 3, assembly 1 is formed by beginning with assembly 110 and filling opening 108 with a fill material 130. In the implementation shown the fill material 130 is the same material from which the organic layer 118 was formed. Fill material 130 is formed separately from the layer 18 through a coat fill and lithography process to achieve the planar configuration shown in FIG. 3 wherein a first surface 132 of fill material 130 is coplanar with a surface of layer 102 (which is the passivation oxide 104). In some implementations the fill material 130 may be formed of a different material than the lens layer, such as an oxide or Layer 112 (color filter) or the like.

A transparent cover 134 is then coupled over the wafer stack and over the ARC, lenses, CFA, and active pixel array, and a standoff 158 of the transparent cover (which is a portion of the transparent cover) is illustrated in FIG. 3. The transparent cover may be formed of a glass oxide 136, though in other implementations other materials may be used. The bonded configuration is not shown, but the standoff of the transparent cover will be directly bonded with the passivation oxide 104 shown in FIG. 3 in order to bond the transparent cover over the wafer stack. This may be done, for example, by fusion bonding the two oxides to one another, such as through a heating/pressuring process.

Figure 4:
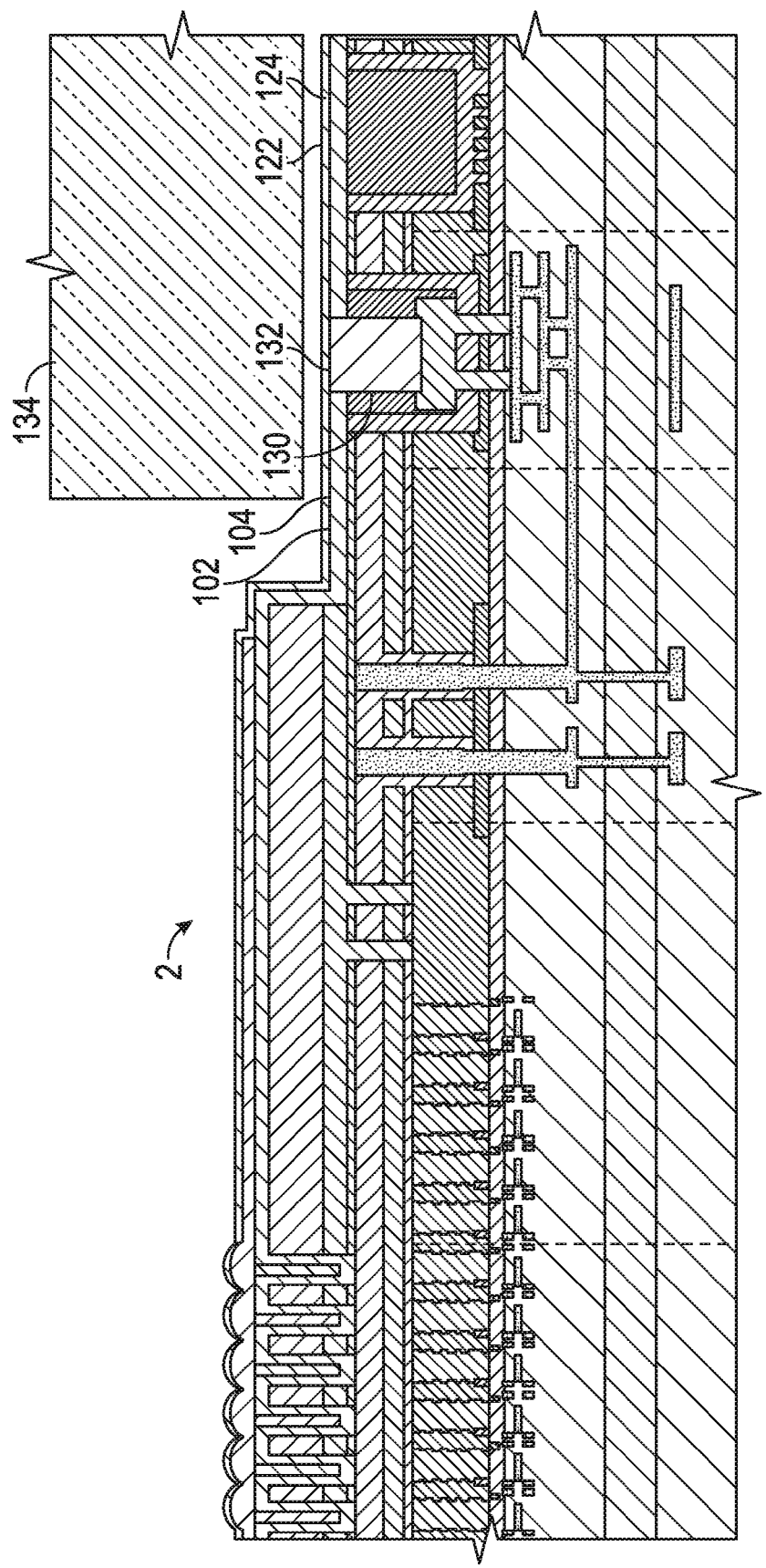
FIG. 4 is a side cross-section view of an implementation of an assembly used in the formation of an image sensor CSP.

FIG. 4 shows assembly 2 which is formed from assembly 106. After the CFA, planarization layer and lens layer are deposited, as described with respect to assembly 110, the steps used to form the fill material 130 and planarize it so that first surface 132 of fill material 130 is coplanar with the passivation oxide 104, are performed. Alternatively, as described previously, the fill material 130 could be formed of the same material as the color filter or lens layer and could be formed at the same time (or it could be formed previous to the lens layer formation). It may also be formed of a different material, such as an oxide, as has also been described.

Once the lens layer and fill material 130 are deposited, the ARC 122 is deposited in such a way that it covers not only the CFA and lens layer but also the lower (recessed) portion of the passivation oxide 104 and the first surface of the fill material 130. The transparent cover is then directly bonded to the ARC oxide. For example, the glass oxide of the transparent cover may be fusion bonded directly with the ARC oxide, such as through a heating process. Thus, in the implementation shown in FIG. 4, the glass oxide of the transparent cover is bonded to an ARC oxide which is over a passivation oxide.

Figure 5:
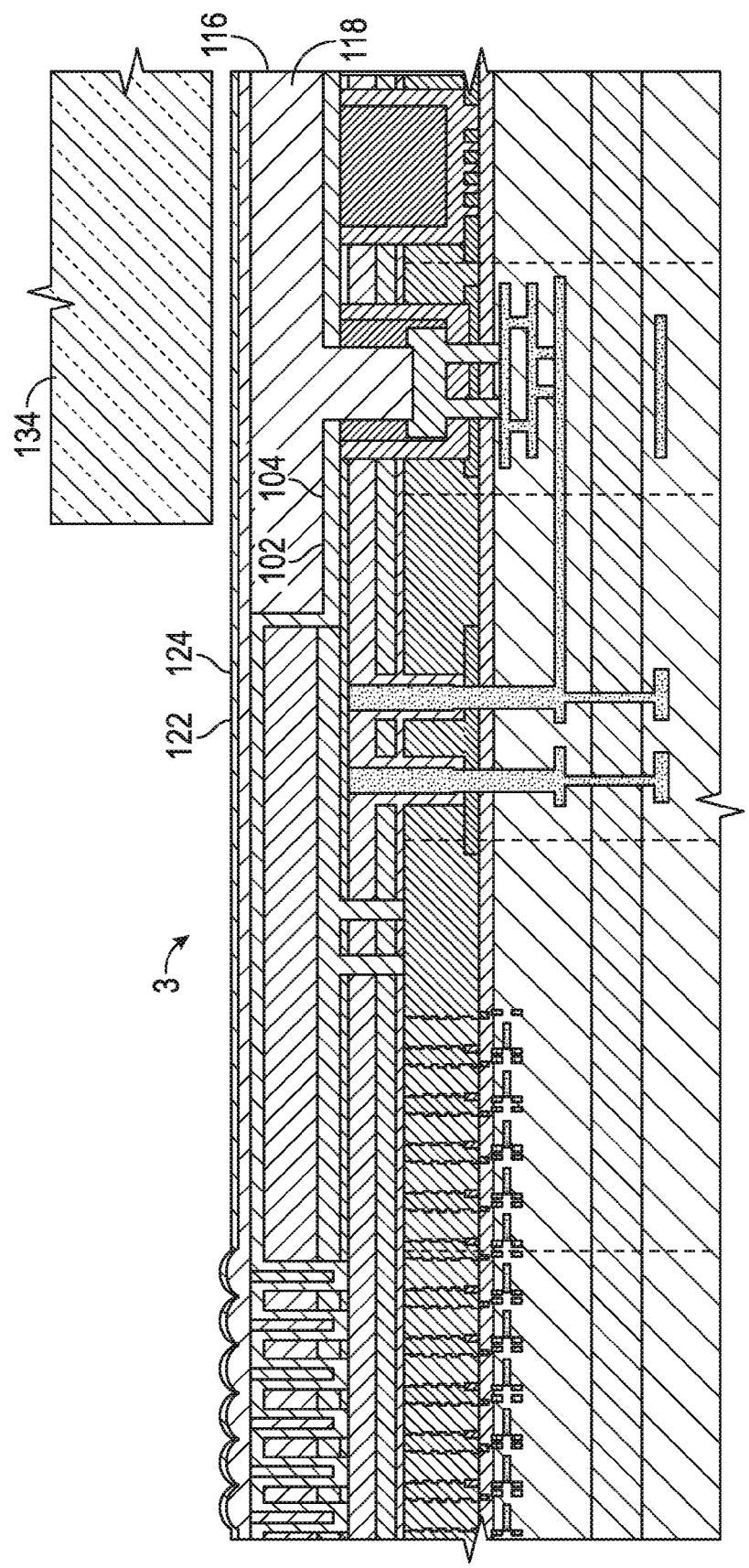
FIG. 5 is a side cross-section view of an implementation of an assembly used in the formation of an image sensor CSP.

FIG. 5 shows assembly 3 which is formed from assembly 106. An organic layer first fills the cavity (called topo fill) through a process of coat and lithography. This is done to reduce streaks or wave defects of the subsequent CFA steps. The CFA is then formed through coat and lithography. Then an organic layer is deposited and planarized either by lithography, etch or CMP. A thin layer of this planarization layer may also remain above the CFA. After that the lens layer is deposited and the lenses are patterned by lithography. In the figure it may be observed that it looks like the lens layer and the underlying planarization layer are the same because they are of the same material. The ARC 122 (which in the implementation shown is an oxide 124) is then deposited over the lens layer, and the transparent cover 134 is then directly bonded to the ARC oxide. For example, the glass oxide of the transparent cover may be fusion bonded directly with the ARC oxide, such as through a heating process. Thus, in the implementation shown in FIG. 5, the glass oxide of the transparent cover is fusion bonded to an ARC oxide over an organic layer (in implementations the ARC oxide and the organic layer may also be fusion bonded with one another).

Figure 6:
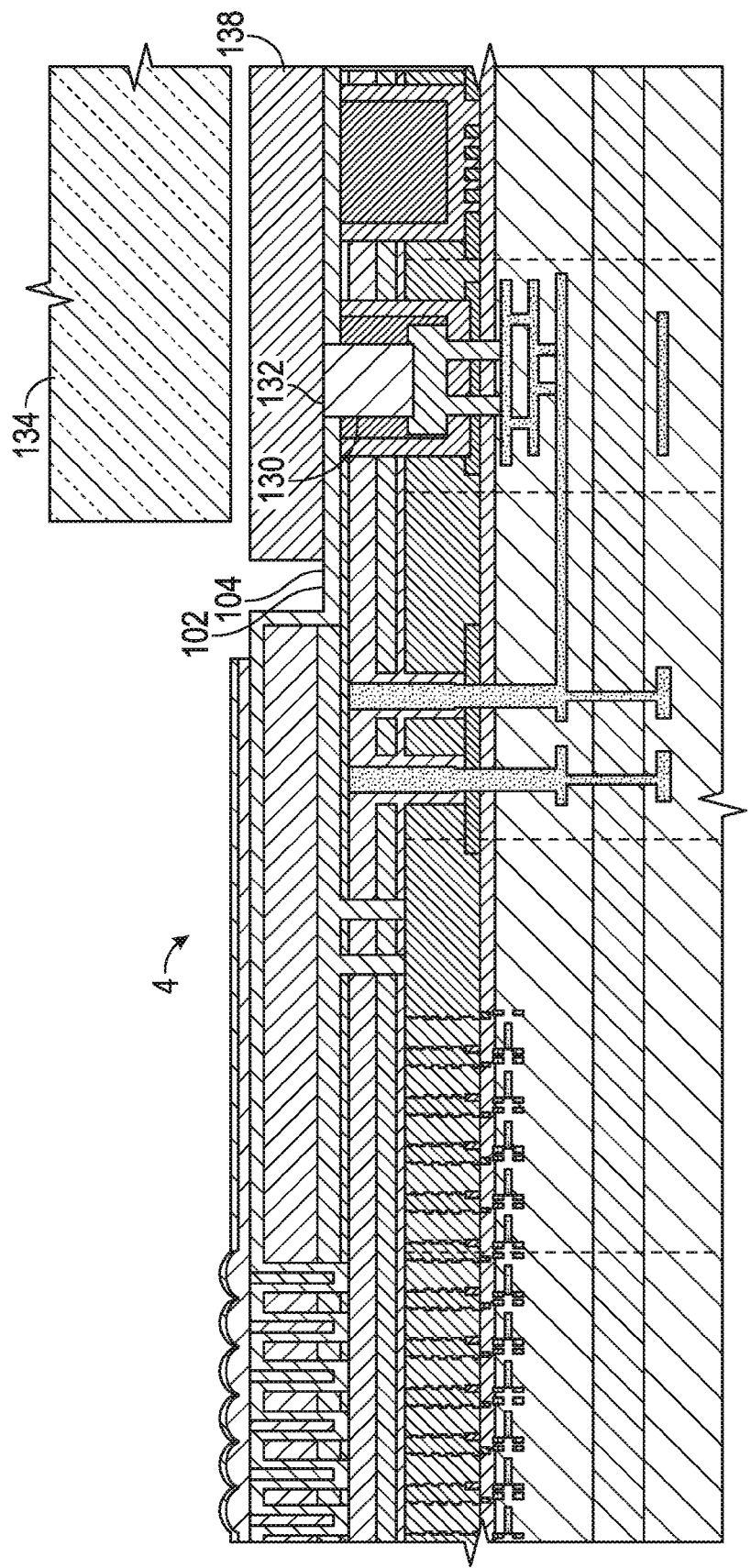
FIG. 6 is a side cross-section view of an implementation of an assembly used in the formation of an image sensor CSP.

FIG. 6 shows assembly 4 which is formed from assembly 106. The CFA is formed by depositing material to form the color filters, and a fill material 130 is formed such that a first surface 132 of the fill material is coplanar or substantially coplanar with the layer 102 (which is a passivation oxide 104). This may be done using a coat and lithography planarization step. The lens layer and ARC layers are also deposited, though they are either deposited in way that they do not cover the lower portion of the layer 102 or they are otherwise removed from the lower portion of the layer 102 after deposition. An organic adhesive 138 is then deposited over the lower recessed portion of layer 102 and covers the first surface of the fill material. The transparent cover 134 is then adhesively bonded with the organic adhesive. Thus, in this implementation the glass oxide of the transparent cover is bonded to an organic layer adhesive. The organic adhesive may be formed of any organic material and may be stencil printed or photodefined (or, in other words, it may be selectively deposited on certain portions of the assembly using photolithography and masking and/or removal techniques). The organic adhesive can be a photo-definable adhesive film in various implementations, such as one formed from a polyimide or a dry film permanent resist material made of silicone resin (i.e., materials manufactured by Shin-Etsu of Tokyo, Japan)

Figure 7:
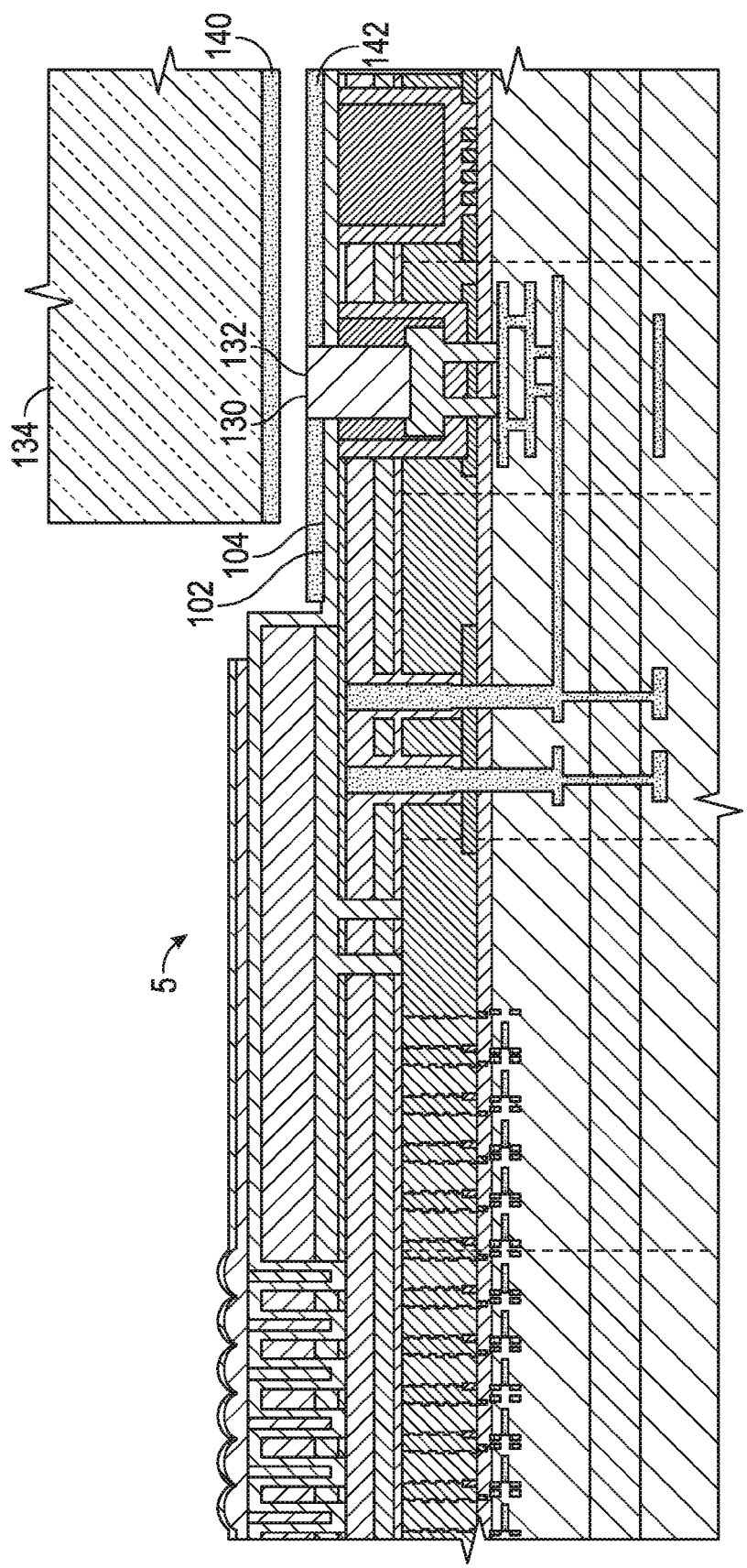
FIG. 7 is a side cross-section view of an implementation of an assembly used in the formation of an image sensor CSP.

FIG. 7 shows assembly 5 which is formed from assembly 106. The CFA is formed by depositing material to form the color filters, and a metallized layer 142 is formed over the lower recessed portion of the assembly. An opening is made in this layer and the fill material 130 is deposited through this opening. A first surface 132 of the fill material is formed to be flush or substantially flush with a top surface of the metallized layer. This may be done through a coat and lithography planarization step. The fill material may be the same material as the lens layer, as described above, and it could also be formed of another material. The individual steps may be done in any order, such as by depositing the fill material first and then later depositing the metallized layer, through any number of photolithographic, masking, and material deposition and/or material removal steps, and the like.

The lens layer and ARC layer are also deposited, and these may be done before, during, or after the steps described above. A first metallized surface 140 is then formed on a bottom surface of the transparent cover 134. The first metallized surface and the metallized layer in implementations are formed of the same material. For example, in the implementation shown they are both formed of copper and/or tin (such as a copper layer covered with a tin layer). In other implementations they are formed of another metal, and in still other implementations they could be formed of different metals—though forming them of the same metal may result in a stronger bond between the two and/or less stress at the interface due to similar lattice structures and/or coefficients of thermal expansion (CTEs). The first metallized surface and the metallized layer are fusion bonded, such as through a heating/pressing process, to bond the transparent cover with the rest of the assembly. In some implementations this heating process may include a reflowing/sintering of one or both layers.

Figure 8:
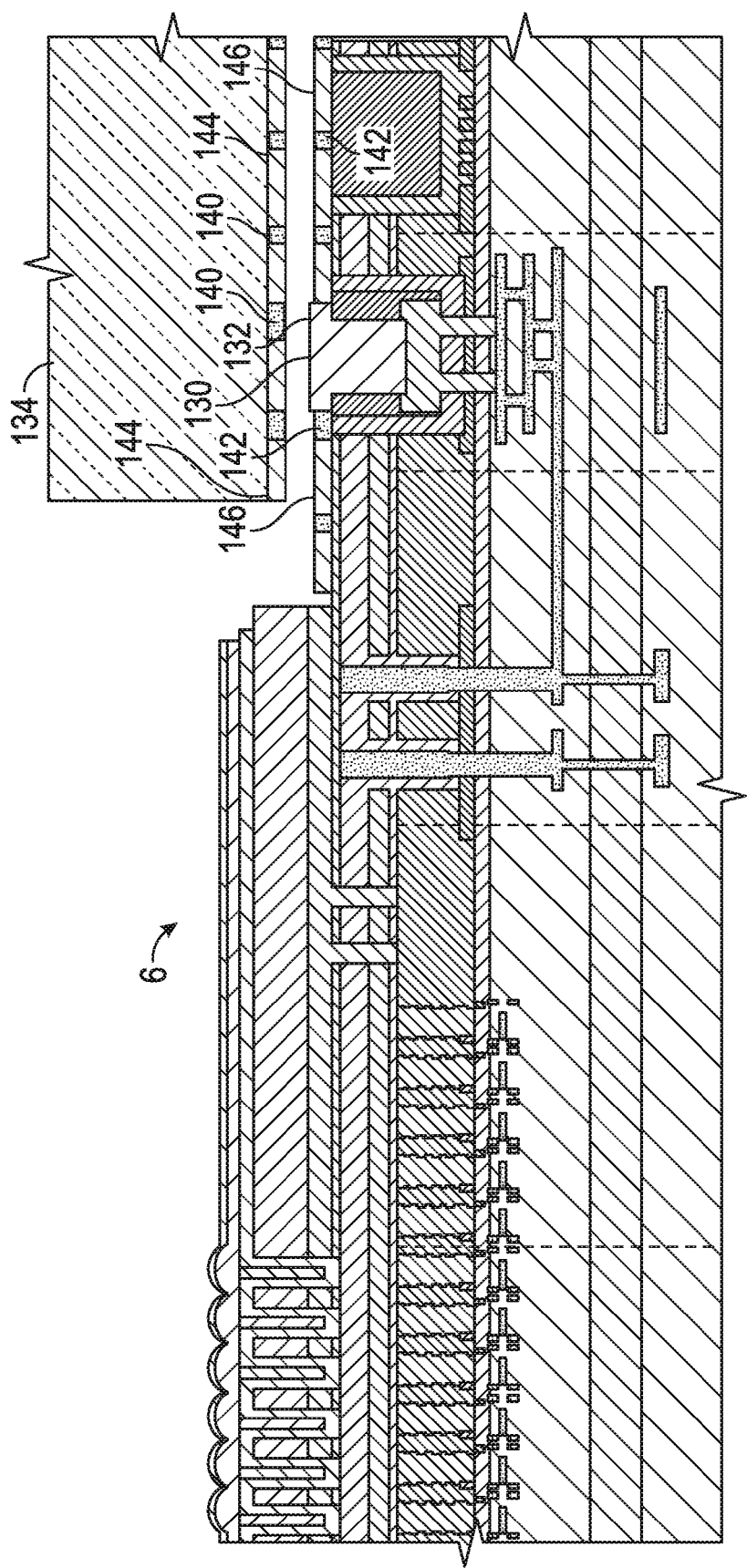
FIG. 8 is a side cross-section view of an implementation of an assembly used in the formation of an image sensor CSP.

FIG. 8 shows assembly 6 which is formed from assembly 106. This assembly is similar to assembly 5 in many ways, and similar assembly steps may be used to form it, except that the first metallized surface 140 includes oxide 144 in specific locations and the metallized layer 142 also includes oxide 146 in corresponding specific locations. These oxide portions of the layers may be formed, by non-limiting example, by selectively removing material from each of the first metallized surface and the metallized layer, and thereafter selectively depositing oxide material in the cavities formed followed by removal of the excess oxide. The oxide could be, by non-limiting example, a silicon oxide such as $SiO_2$, though other oxides could be used.

The oxide of the metallized layer, however, could also be the passivation oxide 104. For example, the passivation oxide 104 could be selectively deposited and/or could be deposited and then portions removed such as through masking and etching or the like to form cavities for receiving the metal of the metallized layer 142 in the cavities which is subsequently deposited. In other implementations the ARC oxide could be used as the oxide 146. Either of these same oxides (the passivation oxide 104 or ARC oxide) could be used as the oxide of the first metallized surface, as well. Once the metal/oxide layers are formed, the first metallized surface and metallized layer are fusion bonded (forming a hybrid bond), such as through a heating process, which may involve a reflowing/sintering of the metal portions as described previously with respect to the previous implementation. The metal portions bond with one another and the oxide portions likewise bond with one another. The metal and oxide of each layer may be formed into any pattern previous to the fusion bond. The metal may be formed of copper and/or tin (and/or a copper layer and a tin layer as described above) though, in other implementations, other metals could be used for the metal portions of the metallized layer and first metallized surface. The metals of each layer and the oxides of each layer could be different metals and oxides, though having the metal and oxide of one layer be the same metal and oxide of the other layer may result in a stronger bond between the two and/or less stress at the interface due to similar lattice structures and/or coefficients of thermal expansion (CTEs).

Figure 9:
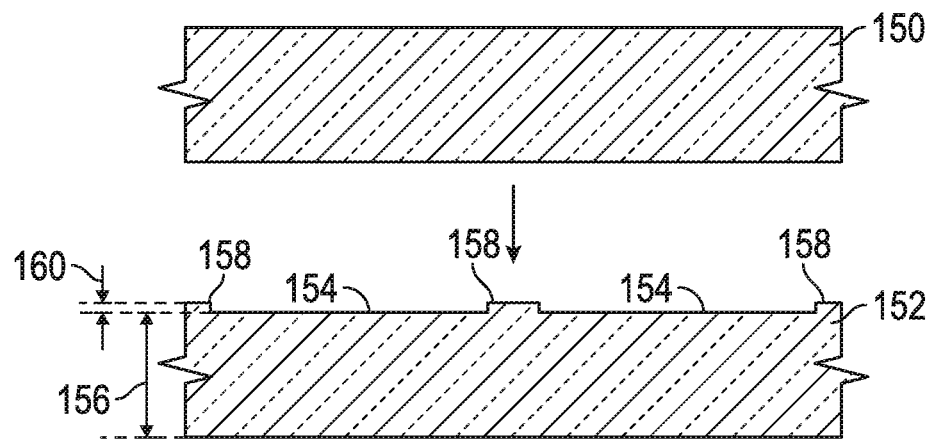
FIG. 9 is a side cross-section view representatively illustrating one or more method steps used in the formation of the image sensor CSPs of FIG. 13.

The top portion of FIG. 9 shows a transparent material 150 which is used to form a transparent cover 152 shown in the bottom portion of FIG. 9. The transparent material may be a glass oxide, as discussed previously, though other materials could be used. A number of cavities 154 are formed in a surface of the transparent material, through any material removal technique such as selective etching or the like, and in this way standoffs 158 are formed. Each standoff has a height 160 above the height 156 of the rest of the transparent material. In some implementations height 156 may be, or is about, 400 microns, and height 160 may be, or is about, 40 microns. Transparent covers 152 could be purchased from a vendor in the configuration shown in the bottom portion of FIG. 9 or the transparent material 150 could be purchased and the cavities formed in-house.

Figure 13:
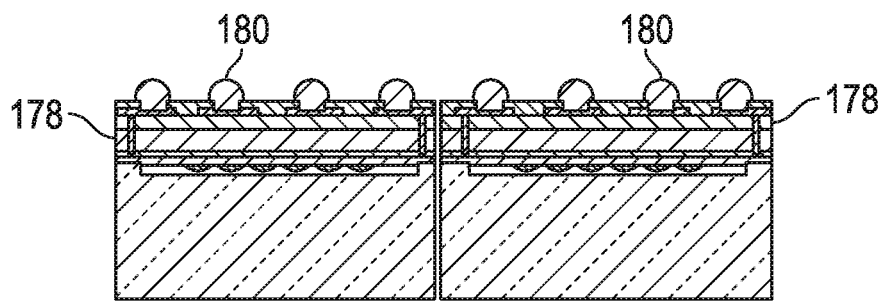
FIG. 13 is a side cross-section view representatively illustrating a plurality of image sensor CSPs.

If first metallized surfaces are to be formed, they should be formed prior to the cavity formation, and in implementations they would be formed (or would remain) generally only on the standoff portions of the transparent cover. Metallization may be formed after the standoff as well. Any material deposition techniques may be used to form the metallized surfaces. It may be pointed out here that in FIGS. 3-8 only one standoff of the transparent cover is shown, for ease of illustration, though the transparent cover in each case extends over the lenses, CFA, and active pixel area, as shown in FIG. 13, and that two standoffs are seen coupling each transparent cover to the stacked assembly. In implementations, such as the implementations shown in FIG. 13, the standoffs actually form rectangular or square perimeters—so that while the cross-section view of each package of FIG. 13 appears to show each transparent cover as having two standoffs, in reality these are just two portions of the same square or rectangular perimeter standoff that outlines the entire package.

Figure 10:
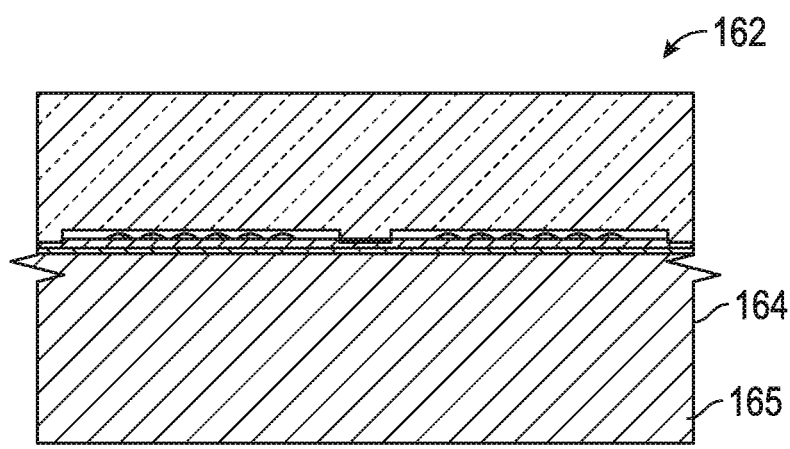
FIG. 10 is a side cross-section view representatively illustrating one or more additional method steps used in the formation of the image sensor CSPs of FIG. 13.

FIG. 10 shows a cross sectional view of an assembly 162 that is formed by coupling the transparent cover of FIG. 9 (which is flipped in FIG. 10) with any of the assemblies previously described. The assembly below the transparent cover is numbered as assembly 164 and is seen to already include a number of layers and lenses, etc., above a wafer 165. For ease of illustration this is shown in a simplified format—it should be understood that assembly 164 could include any of assemblies 1-6 including all of their wafers, layers, oxides, cavities, vias, conductive lines, pads, and so forth, that have been described previously. The coupling stage involves alignment of the transparent cover so that the standoffs are in the proper location, though in some cases very fine alignment is unnecessary. The bond process may include a cure cycle and/or a reflowing of material depending in which type of material and/or bond is used to bond the transparent cover with the rest of the assembly.

Figure 11:
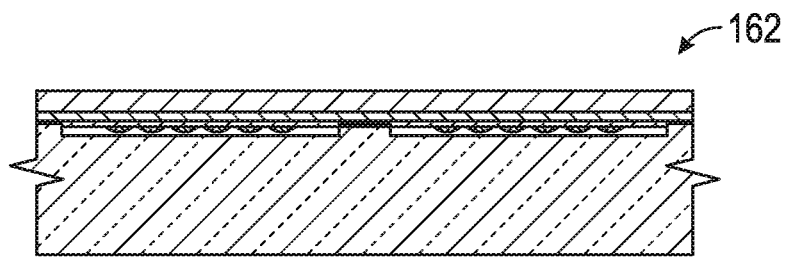
FIG. 11 is a side cross-section view representatively illustrating one or more additional method steps used in the formation of the image sensor CSPs of FIG. 13.
Figure 12:
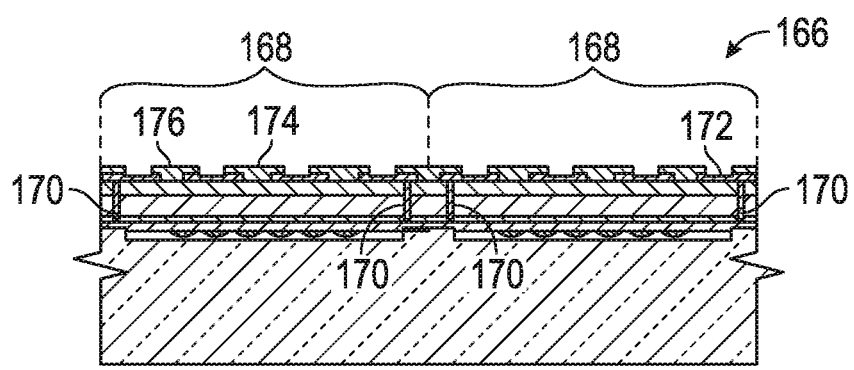
FIG. 12 is a side cross-section view representatively illustrating one or more additional method steps used in the formation of the image sensor CPs of FIG. 13.

FIG. 11 shows assembly 162 except flipped and with a portion of assembly 164 thinned down. Thinning of the wafer stack may be done so that the resulting CSP is thinner, and the thinning may be done by any material removal techniques such as etching, polishing, and so forth. FIG. 12 shows assembly 166 which is formed from assembly 162 by including a number of vias 170 (which in the implementation shown are through-silicon vias (TSVs), a redistribution layer (RDL) 172, and a layer 174 of material having openings accessing the RDL, which could be formed of a solder resist 176 or of some other material. Under-bump metallization (UBM) could also be formed over the exposed portions of the RDL if solder bumps are to be used in final packaging. At this stage the assembly 166 forms a number of unsingulated chip scale packages (CSPs) 168.

Figure 14:
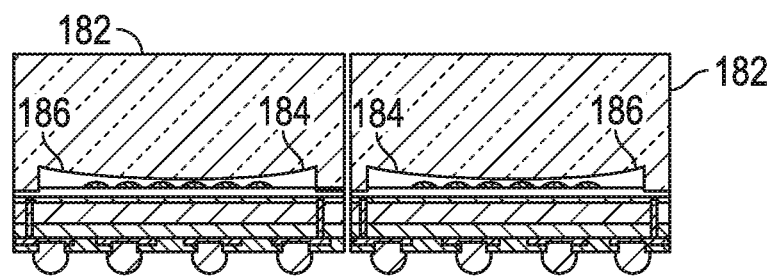
FIG. 14 is a side cross-section view representatively illustrating a plurality of image sensor CSPs having transparent covers which include global lenses.

FIG. 13 shows two singulated image sensor CSPs 178 formed by singulating them from the assembly 166. Any singulation technique may be used, such as sawing, laser drilling, water jet cutting, and so forth. In the implementation shown a saw procedure is used. Solder bumps 180 are formed over the exposed portions of the RDL (or over the UBM over the RDL) so that the CSPs have a flip-chip configuration. The transparent cover of image sensor CSPs 178 are seen to not form a lens, though there are lenses over the CFA as previously described. FIG. 14 shows two singulated image sensor CSPs 182 formed in a similar manner as previously described for image sensor CSPs 178 except that the transparent covers include lenses 184 therein. These may be formed at the processing steps shown in FIG. 9 and may include global lenses 186. FIG. 14 also shows the assembly flipped with the bumps facing downwards which may be the configuration for installing the CSP on a mother board, printed circuit board (PCB), or other structure, such as in a smart phone, tablet, laptop, or any other computing device mobile or otherwise. Although the lens could be excluded from the transparent cover, including a lens in the cover as illustrated in FIG. 14 may allow field flattening and may reduce the cost and complexity of the lens stack above the CSP package (i.e., the lenses of the lens layer and/or the ARC layer previously described).

Different portions of the methods described herein may be performed at different locations/factories. For assembly 1 for example, the passivation oxide may be formed at a front-end-of-line (FEOL) foundry. For assemblies 2 and 3 the ARC oxide may be deposited at a CFA foundry that forms the color filter array. For assemblies 5 and 6 the metallized layers 142 may be formed at a FEOL foundry. Other examples and workflows are possible.

The methods disclosed herein thus include methods of integrating semiconductor wafer stacking, forming of a CFA/uLens/ARC structure/process (such as those described in the patent publications that have been incorporated herein by reference) with a chip-scale package (CSP) bonding and manufacturing processes. Surface topography may be planarized at a FEOL foundry and/or at a CFA foundry and/or at FEOL/CFA levels. The fill material for filling the first and/or second cavities may be a permanent fill material, as shown in the drawings. The CSP packages and methods of forming the same thus may include a glass having one or more pre-formed cavities and a bond formed by one or more of: a glass oxide bonded with a passivation oxide (fusion bond); a glass oxide bonded with an ARC oxide (fusion bond) where the ARC oxide is over a passivation oxide; a glass oxide bonded with an ARC oxide (fusion bond) where the ARC oxide is over an organic layer; a glass oxide bonded with an organic layer adhesive; metallization on glass of the transparent cover bonded with metallization on the stacked wafer surface, and; oxide and metallization on glass of the transparent cover bonded with metallization and oxide over the stacked wafer (hybrid bond). The transparent cover of any of the packages described herein may include a global lens integrated in a glass layer.

In any of the implementations of CSPs disclosed herein the wafer stack may have a top-to-bottom height (excluding layers over the sensor wafer and any structures over those layers) of, or of about, 100 microns.

Although not shown in any of the implementations illustrated, any of the assemblies and/or CSPs disclosed herein may have a light block layer, such as by non-limiting example, on the inner side of the glass cover (though in other implementations it could be formed in other locations), such as to block ultraviolet (UV) light. Any material or layer that substantially blocks UV light but substantially allows other wavelengths of light to pass therethrough (such as visible wavelengths) may be used.

Any of the CSP structures/methods disclosed herein may be used to form complementary metal-oxide-semiconductor (CMOS) image sensor (CIS) packages.

Implementations of methods and devices disclosed herein may be used to form CSP packages where the die size is very close to the pixel array size. In conventional methods of formation of image sensor CSP packages a keep out zone (KOZ) must be included. The KOZ requires a certain distance between the active pixel array and the die edge to account for dam/adhesive bleed during dispense and bonding procedures. The methods and devices disclosed herein may be formed without requiring a KOZ as there will be no adhesive bleed during bonding of the transparent cover with the wafer stack, so that any gap between the active pixel array and the edge of the die may be decreased. By non-limiting example, in one conventional image sensor CSP package the distance between the active pixel array and the edge of the die/package is about 800 microns (forming an 800 micron wide perimeter around the active pixel array), while image sensor CSP packages using the disclosed methods may be formed having a distance between the active pixel array and the edge of the die/package of only 300 microns (forming a 300 micron wide perimeter around the active pixel array) or less than 300 microns.

In implementations the image sensor devices disclosed herein may be formed without the use of any additional adhesive(s) to bond the transparent cover with the wafer stack other than the ARC oxide or a passivation oxide of the wafer stack or CFA/uLens/ARC structure. One or more of the stacking processes and/or processes of forming the CFA, uLens, ARC, and/or other layers of the image sensor CSP package are thus also used for bonding the transparent cover over the assembly. In implementations the methods used herein do not require any additional masks other than those that would be used in the formation of the CFA/uLens/ARC structure and/or other underlying structures of the image sensor CSPs.

Although forming an image sensor chip scale package (CSP) by bonding a transparent cover over the fill material and over the one or more layers may be included in various method implementations, included, this language is not meant to convey that any or all of the steps disclosed relative to FIGS. 9-14 are excluded in any such method. Additionally, although the language forming a chip scale package by bonding a transparent cover is used, this is not meant to convey that the final CSP formation step is necessarily the step of bonding the transparent cover over the fill material and the one or more layers, but instead the final formation steps of the CSP may be one or more other or additional processing steps such as those shown in FIGS. 9-14 to form the contacts and/or bumps and so forth.

Although the devices and elements disclosed herein specifically reference examples of image sensor CSPs, the methods and elements may be used for any semiconductor package fabrication method or device wherein conventional methods of bonding a cover or other element with an assembly would conventionally require a larger width or die size (or smaller active area, pixels or otherwise) due to dam/adhesive material bleed.

"Chip scale package" with respect to one or more of the image sensor CSP implementations disclosed herein may be defined as a package wherein the package has an area no greater than 1.2 times that of the die. "Chip scale package" with respect to one or more of the image sensor CSP implementations disclosed herein may be further defined as a package including only a single semiconductor die and/or a package that is direct surface mountable and/or a package having a solder ball (bump) pitch no more than 1 mm.

In places where the description above refers to particular implementations of image sensor chip scale packages and related methods and implementing components, sub-components, methods and sub-methods, it should be readily apparent that a number of modifications may be made without departing from the spirit thereof and that these implementations, implementing components, sub-components, methods and sub-methods may be applied to other image sensor chip scale packages and related methods.

What is claimed is:
1. A method of forming an image sensor chip scale package (CSP), comprising:
 providing a semiconductor wafer (wafer) having an array of pixels;
 forming a first cavity through one of the wafer and one or more layers coupled over the wafer;
 filling the first cavity with a fill material;

planarizing one of the fill material and the one or more layers to form a first surface of the fill material that is coplanar with a first surface of the one or more layers, and;

forming an image sensor chip scale package (CSP) by bonding a transparent cover over the fill material and over the one or more layers using one of:
- a fusion bond between the transparent cover and a passivation oxide, and;
- a fusion bond between the transparent cover and an anti-reflective coating.

2. The method of claim 1, wherein no adhesive is used to bond the transparent cover over the fill material and over the one or more layers.

3. The method of claim 1, further comprising wherein when the fusion bond is between the transparent cover and the anti-reflective coating (ARC), the ARC is coupled over a passivation oxide layer.

4. The method of claim 1, wherein the anti-reflective coating (ARC) is coupled over an organic layer.

5. The method of claim 1, wherein the planarizing comprises chemical mechanical polishing (CMP).

6. The method of claim 1, wherein the fill material comprises an oxide.

7. The method of claim 1, further comprising forming one of a cavity and a lens in the transparent cover.

8. The method of claim 1, wherein the image sensor CSP comprises a plurality of stacked semiconductor wafers.

9. The method of claim 1, further comprising forming a second cavity through one of the wafer and the one or more layers and filling the second cavity with one of the fill material and a second fill material.

10. The method of claim 1, wherein the first surface of the fill material is coplanar with a plane that intersects a color filter array (CFA) of the image sensor CSP.

11. A method of forming an image sensor chip scale package (CSP), comprising:
providing a semiconductor wafer (wafer) having an array of pixels;
forming a first cavity through one of the wafer and one or more layers coupled over the wafer;
filling the first cavity with a fill material;
planarizing one of the fill material and the one or more layers to form a first surface of the fill material that is coplanar with a first surface of the one or more layers, and;
after planarizing, forming an image sensor chip scale package (CSP) by bonding a transparent cover over the fill material and over the one or more layers by bonding the transparent cover with an organic adhesive coupled over the fill material.

12. The method of claim 11, wherein the planarizing comprises chemical mechanical polishing (CMP).

13. The method of claim 11, further comprising forming a second cavity through one of the wafer and the one or more layers, filling the second cavity with one of the fill material and a second fill material, and planarizing one of the fill material and the second fill material to form a second surface coplanar with the first surface of the one or more layers, the second surface formed directly over the second cavity.

14. The method of claim 11, further comprising forming one or more openings through a layer defining the first cavity to test one or more electrical functions of the image sensor CSP.

15. A method of forming an image sensor chip scale package (CSP), comprising:
providing a semiconductor wafer (wafer) having an array of pixels;
forming a first cavity through one of the wafer and one or more layers coupled over the wafer;
filling the first cavity with a fill material;
planarizing one of the fill material and the one or more layers to form a first surface of the fill material that is coplanar with a first surface of the one or more layers, and;
forming an image sensor chip scale package (CSP) by bonding a transparent cover over the fill material and over the one or more layers by bonding a first metallized surface of the transparent cover with a metallized layer coupled over the wafer.

16. The method of claim 15, wherein no adhesive used to bond the transparent cover over the fill material and over the one or more layers.

17. The method of claim 15, wherein the first metallized surface comprises oxide in particular locations that correspond with particular locations of oxide comprised in the metallized layer.

18. The method of claim 15, further comprising forming a second cavity through one of the wafer and the one or more layers, filling the second cavity with one of the fill material and a second fill material, planarizing one of the fill material and the second fill material to form a second surface coplanar with the first surface of the fill material, and bonding the transparent cover over a full diameter of the first cavity and over at least a portion of a diameter of the second cavity.

19. The method of claim 15, further comprising forming one of a cavity and a global lens in the transparent cover.

20. The method of claim 15, further comprising forming at least a portion of a testing contact within the first cavity, the testing contact configured to test one or more electrical functions of the image sensor CSP.

* * * * *